United States Patent [19]

Williamson

[11] Patent Number: 5,606,289
[45] Date of Patent: Feb. 25, 1997

[54] AUDIO FREQUENCY POWER AMPLIFIERS WITH ACTIVELY DAMPED FILTER

[75] Inventor: Robert C. Williamson, Mountlake Terrace, Wash.

[73] Assignee: Carver Corporation, Lynnwood, Wash.

[21] Appl. No.: 487,885

[22] Filed: Jun. 7, 1995

Related U.S. Application Data

[63] Continuation-in-part of Ser. No. 263,462, Jun. 22, 1994, Pat. No. 5,543,753.

[51] Int. Cl.$^6$ .................................................. H02M 1/14
[52] U.S. Cl. .......................................... 330/297; 363/40
[58] Field of Search ................................. 330/127, 297; 363/39, 40, 41

[56] References Cited

U.S. PATENT DOCUMENTS

| | | | |
|---|---|---|---|
| 2,776,382 | 1/1957 | Jensen | 307/97 |
| 3,142,807 | 7/1964 | Sharma | 330/15 |
| 3,268,826 | 8/1966 | Harrison et al. | 330/13 |
| 3,319,175 | 5/1967 | Dryden | 330/22 |
| 3,426,290 | 2/1969 | Jensen | 330/40 |
| 3,483,425 | 12/1969 | Yanishevsky | 315/18 |
| 3,542,953 | 11/1970 | Munch, Jr. | 179/1 |
| 3,585,517 | 6/1971 | Herbert | 330/10 |
| 3,596,172 | 8/1966 | Harrison | 323/45 |
| 3,832,643 | 8/1974 | Van Heyningen et al. | 330/15 |
| 3,961,280 | 6/1976 | Sampei | 330/40 |
| 4,015,213 | 3/1977 | Hamada | 330/10 |
| 4,048,573 | 9/1977 | Evans et al. | 330/2 |
| 4,054,843 | 10/1977 | Hamada | 330/263 |
| 4,087,759 | 5/1978 | Iwamatsu | 330/262 |
| 4,092,610 | 5/1978 | White et al. | 330/207 |
| 4,115,739 | 9/1978 | Sano et al. | 330/263 |
| 4,217,632 | 8/1980 | Bardos et al. | 363/26 |
| 4,218,660 | 8/1980 | Carver | 330/297 |
| 4,409,559 | 10/1983 | Amada et al. | 330/295 |
| 4,472,687 | 9/1984 | Kashiwagi et al. | 330/297 |
| 4,484,145 | 11/1984 | Haulin | 330/9 |
| 4,484,150 | 11/1984 | Carver | 330/297 |
| 4,507,619 | 3/1985 | Dijkstra et al. | 330/297 |
| 4,808,946 | 2/1989 | Carver et al. | 330/297 |
| 4,937,719 | 6/1990 | Yamada et al. | 363/39 |
| 5,075,634 | 12/1991 | French | 330/146 |
| 5,200,711 | 4/1993 | Andersson et al. | 330/267 |
| 5,543,753 | 8/1996 | Williamson | 330/297 |

FOREIGN PATENT DOCUMENTS

| | | | |
|---|---|---|---|
| 2552600 | 3/1985 | France | H03F 3/21 |
| 1918618 | 10/1970 | Germany | H03F 3/26 |
| 2407629 | 8/1975 | Germany | H03F 3/66 |
| 2542171 | 4/1976 | Germany | H03F 3/217 |
| 49-118261 | 4/1976 | Japan | H03F 1/02 |
| 52-4757 | 1/1977 | Japan | H03F 3/20 |
| 51-35530 | 10/1977 | Japan | H03F 3/20 |
| 51-35531 | 10/1977 | Japan | H03F 3/20 |

(List continued on next page.)

OTHER PUBLICATIONS

"An Amplifier With A Tracking Power Supply", For The Engineer, by V. M. Kibakin, Nov. 5, 1977.
"A High-Efficiency Audio Power Amplifier", Audio Engineering Society Reprint, Oct. 30–Nov. 2, 1981.
"The Class BD High-Efficiency RF Power Amplifier", Journal of Solid-State Circuits, vol. SC-12, Jun. 1977.
"Band Pass Current Control", by Allen F. Rozman and Jeffrey J. Boylan, APEC 94 vol. 2 (pp. 631–637), 1994 IEEE.
"Output Impedance Considerations for Switching Regulators with Current-Injected Control", by Schoneman and Mitchell, IEEE Transactions on Power Electronics, vol. 4, No. 1, Jan. 1989.

*Primary Examiner*—Steven Mottola
*Attorney, Agent, or Firm*—Hughes, Multer & Schacht, P.S.

[57] ABSTRACT

An inverter for an audio amplifier. The inverter comprises a current damped feedback loop for actively damping oscillations caused by an output inductor within the inverter. A forward compensator is provided to compensate for the frequency response of the actively damped filter. The resulting inverter generates an output voltage that tracks an input voltage thereof with improved frequency response within the frequency range of interest.

69 Claims, 12 Drawing Sheets

FOREIGN PATENT DOCUMENTS

| | | | |
|---|---|---|---|
| 53-94162 | 8/1978 | Japan | H03F 3/217 |
| 56-58303 | 5/1981 | Japan | H03F 11/02 |
| 56-89105 | 7/1981 | Japan | H03F 11/02 |
| 57-23310 | 2/1982 | Japan | H03F 3/217 |
| 57-140008 | 8/1982 | Japan | H03F 3/21 |
| 58-14606 | 1/1983 | Japan | H03F 1/02 |
| 58-105606 | 6/1983 | Japan | H03F 1/02 |
| 58-119209 | 7/1983 | Japan | H03F 1/02 |
| 59-17710 | 1/1984 | Japan | H03F 3/20 |
| 1-147907 | 6/1989 | Japan | H03F 1/02 |
| 559362 | 7/1977 | U.S.S.R. | H03F 3/20 |

MODULATOR

AUDIO FREQUENCY POWER AMPLIFIERS WITH ACTIVELY DAMPED FILTER

RELATED APPLICATIONS

This application is a continuation-in-part application of U.S. Ser. No. 08/263,462, filed Jun. 22, 1994, and now U.S. Pat. No. 5,543,753.

TECHNICAL FIELD

The present invention relates to the amplification of audio frequency signals and, more particularly, to filters used in switch mode converters of a tracking power supply.

BACKGROUND OF THE INVENTION

To reduce dissipation losses in the output stage, most audio frequency amplifiers comprise a class B or AB amplifier. A conventional class B or AB amplifier comprises a pair of emitter-coupled output transistors configured in a push-pull arrangement. The audio frequency signal is applied to the bases of these output transistors and the amplifies audio frequency signal is present at the emitters thereof. In a conventional push-pull amplifier, the collector of one of the output transistors is connected to a fixed positive DC voltage to provide a current source and the collector of the other of the output transistors is connected to a fixed negative DC voltage to provide a current sink. The positive and negative DC voltages are commonly referred to as the source and sink voltages, respectively.

With a reactive load, the entire fixed voltage is present across the amplifying transistor of a class B or AB amplifier when current flows to the load, yielding high dissipation losses. These losses are particularly high with high dynamic range signals such as music signals. Accordingly, while more efficient than a pure class A amplifier, class B and AB amplifiers still exhibit significant dissipation losses with resistive loads and exhibit considerably greater losses with reactive loads. At the high power levels of modern audio amplifiers, these dissipation losses require the use of numerous expensive high power semiconductors in parallel and also that extensive steps be taken to cool the output transistors.

To obtain higher efficiencies, class D amplifiers have also been proposed as audio amplifiers. Class D amplifiers comprise a power transistor, a low pass filter, and a freewheeling diode or rectifier in parallel with the low pass filter. The power transistor is switched on and off according to a high frequency square wave signal the pulse width of which is modulated according to the audio frequency signal to be amplified. The filter then recovers the audio frequency signal by filtering off the high frequency square wave signal. The class D amplifier achieves high efficiencies by delivering current only when substantially zero volts are present across the power transistors.

While significantly more efficient than a class B or AB amplifier, a class D amplifier has high distortion that cannot be easily corrected with negative feedback because of the phase shift introduced by the low pass filter. Further, the low pass filter tends to interact with the load in an undesirable fashion. Also, because of the relatively high frequencies involved, class D amplifiers exhibit poor supply rejection and thus are highly susceptible to power supply disturbances. For these and other reasons, class D amplifiers have not been used in commercial audio amplifiers.

Two other classes of high efficiency audio frequency amplifiers have been proposed to increase the efficiency of output transistors arranged in a push-pull configuration. These amplifiers are referred to as class G and class BD amplifiers and employ adaptive power supplies for generating source and sink voltages for a push-pull amplifier. These adaptive power supplies generate source and sink voltages that increase and decrease as the audio frequency signal increases and decreases. The basic idea with these amplifiers is to provide high voltage to the push-pull amplifier only when the audio frequency signal is high. As an audio frequency signal developed from a musical source is normally relatively low with infrequent high bursts, class G and BD amplifiers used as audio amplifiers normally maintain the voltage across the power transistors at a low level, thereby greatly reducing the average power dissipation of the output transistors.

A class G amplifier normally comprises a push-pull amplifier and a stepped power supply that generates source and sink voltages that are increased and decreased in two or three discrete steps as the power requirement of the signal being amplified increases and decreases. Such an amplifier is disclosed, for example, in U.S. Pat. No. 4,484,150 to Carver and U.S. Pat. No. 3,961,280 to Sampei.

A class BD amplifier conventionally comprises a pair of highly efficient class D amplifiers to provide signal tacking source and sink voltages to a push-pull amplifier. Class BD amplifiers are generally discussed in the following articles: (a) The Class BD High-Efficiency RF Power Amplifier dated June 1977 and written by Frederick H. Raan; and (b) An Amplifier With A Tracking Power Supply dated Nov. 5, 1973, and written by V. M. Kibakin.

The present invention is particularly useful when implemented in the context of audio amplifiers containing tracking power supplies, and that application will be discussed detail herein. However, the present invention has broader application to buck converters in which the output is designed to track a fine-varying input signal. Accordingly, the scope of the present invention should be determined according to the claims appended hereto and not the following detailed discussion.

Tracking power supplies can be classified as envelope trackers, rail-to-ground tracker, and rail-to-rail trackers; the present invention may be used to advantage in each of these configurations.

Exemplary envelope trackers are disclose din U.S. Pat. No. 3,426,290 issued 4 Feb. 1969 to Jensen, U.S. Pat. No. 4,218,660 issued 19 Aug. 1980 to Carver, and, more recently, U.S. Pat. No. 5,075,634 issued 24 Dec. 1991 to French.

Rail-to-ground tracking power supplies are disclosed in U.S. Pat. No. 4,054,843 issued 18 Oct. 1977 to Hamada, U.S. Pat. No. 4,409,559 issued 11 Oct. 1983 to Amada, an article published by the Audio Engineering Society in 1981 entitled A HIGH EFFICIENCY AUDIO POWER AMPLIFIER (Nakagaki and Amada), and U.S. Pat. No. 4,507,619 issued 26 Mar. 1985 to Dijkstra.

Rail-to-rail tracking power supplies are disclosed in U.S. Pat. No. 4,087,759 issued 2 May 1978 to Iwamatsu, U.S. Pat. No. 4,472,687 issued 18 Sep. 1984 to Kashiwagi et al., and U.S. Pat. No. 5,200,711 issued 6 Apr. 1993 to Anderson et al.

In an amplifier having any one of these three types of tracking power supplies, the collector-emitter voltage across the amplifying transistor will ideally remain substantially constant at a low value. The basic advantage of all types of tracking power supplies is thus that dissipation losses in the amplifying transistor are reduced. Additionally, in tracking power supplies, dissipation losses of the amplifying device are ideally kept low for both resistive and reactive loads.

A tracking power supply in a class BD amplifier will thus in general reduce by varying degrees the dissipation of the output transistor relative to the dissipation of the output transistors in a pure class B or AB amplifier. Rail-to-rail tracking power supplies are theoretically the most efficient, while envelope tracking power supplies are the least efficient of the three types of tracking power supplies. Rail-to-ground and rail-to-rail tracking power supplies will also have the additional advantage of reducing the voltage rating requirements of the output transistors.

As mentioned, in theory the most efficient of the various amplifier configurations having tracking power supplies is the rail-to-rail tracking power supply as described above.

In related U.S. patent application Ser. No. 08/154,739 assigned to the Assignee of this application, the Applicants recognized that prior art amplifiers having signal tracking powers supplies do not precisely track the signal being amplified; instead, the source and sink supply voltages deviate from their theoretical levels under the following conditions: (a) high frequency audio signals; (b) open circuit or light loads; (c) certain reactive loads; (d) asymmetric signals; and/or (e) high offset voltages of a tracking power supply is referred to as floating.

The '739 application further recognized that this floating occurs because, under the conditions described above, insufficient current flows through the amplifying transistor to pull the supply voltage towards the reference when the audio frequency signal being tracked moves towards the reference. In particular, a class BD amplifier comprises a class B or AB output stage and a power supply containing source and sink output filters, each output filter comprising an inductor and an output capacitor. When little or no current is being drawn by the output stage, no current flows back through the inductors of the output filters to discharge the output capacitors. The source and sink voltages thus tend to hang or float until the output devices begin to draw current to discharge the output capacitors. The difference between the floating source supply voltage and the plunging sink supply voltage can become very large, and this large voltage difference can last from one cycle of the audio frequency signal to the next cycle thereof.

The large voltage across the output stage caused by floating can result in high dissipative losses in the output devices and thus requires high power transistors with a large safe operation area. The large voltages that can momentarily develop across the amplifier output stage also require that the transistors have a high breakdown voltage. Without high dissipative capacity and high breakdown voltage, the likelihood that the output devices will fail under the conditions during which floating occurs is greatly increased.

The '739 application thus proposed an audio frequency amplifier comprising a signal tracking power supply having at least one output filter and further comprising discharge means for discharging an output capacitor of the power supply output filter, thereby ensuring that the source supply voltage follows the audio frequency signal back down and/or that the sink supply voltage follows the audio frequency signal back up after the slope of the audio frequency signal changes signs.

Discharge means as described in the '739 application will guarantee that the source and sink supply voltages will not float. This results in a predetermined maximum voltage value across the output stage. Therefore, by setting this predetermined maximum voltage value at a low level, low voltage devices can be used in the output stage of a rail-to-rail tracking power supply and, to a lesser extent, of a rail-to-ground tracking power supply.

OBJECTS OF THE INVENTION

From the foregoing, it should be apparent that a primary object of the present invention is to obtain a design for a highly efficient audio frequency power amplifier having a tracking power supply.

Another more specific object of the present invention is to obtain an audio frequency amplifier having a favorable mix of the following characteristics:

a. low distortion;

b. low thermal dissipation;

c. light weight;

d. high power;

e. allows a rail-to-rail tracking amplifier to be commercially viable;

f. allows elimination of a high voltage preamplifier; and g. low manufacturing costs through the use of low voltage components having a relatively small safe operation area throughout the output stage.

Other objects of the present invention will become apparent from the following detailed description of the invention.

SUMMARY OF THE INVENTION

The Applicants have recognized that, while discharge means as described in the '739 application can lock the source and sink supply voltages together to prevent the voltage difference across the output stage from exceeding a predetermined maximum value, phase error in the overall frequency response of the system can cause the supply voltages to vary from the signal being tracked, resulting in a distorted output signal. This problem is especially acute at high frequencies because the resonant frequency of the inductor used in the output filter of the tracking power supply is relatively close to the highest frequency of interest of the system.

Therefore, while the discharge means disclosed in the '739 patent can guarantee that the source and sink supply voltages will track the output signal, these supply voltages may be slightly offset from the output signal due to phase shift introduced by the power supply output filter.

To overcome the problem in frequency response caused by the power supply output filter, the present invention provides a class BD amplifier comprising: (a) an output stage for amplifying an input voltage to obtain an amplified output signal; (b) a tracking power supply having an output filter comprising an inductor and a capacitor; (c) an active damping control circuit for actively damping oscillations in the power supply output filter; and (d) a compensation circuit for compensating for the frequency response of the actively damped output filter.

The operation of an amplifier so constructed can perhaps best be explained using the terminology employed in control theory to describe a pole-zero diagram. In this context, the inductor in the power supply output filter results in two poles being placed on the pole-zero diagram; these poles are equally spaced above and below the σ-axis and lie fairly close no the jω-axis. This arrangement of poles is inherently unstable, as it does not take much for these poles to move into the right half of the s-plane.

The active damping control circuit effectively damps oscillations in the filter to move the poles contributed by the inductor onto the σ-axis and away from the right half of the s-plane. Because the two poles contributed by the actively damped inductor now lie on the σ-axis, they can easily be compensated for by the compensating circuit. In particular, the compensating circuit places two zeros on top of the two poles contributed by the actively damped inductor to cancel the effect of these poles. The result is a single remaining pole located on the pole-zero diagram near the origin; this remaining pole is contributed by the error amplifier. Such a system provides a stable, nearly flat frequency response within the frequency range of interest.

To the extent that the zeroes provided by the compensating circuit are misaligned with the poles contributed by the actively damped output filter, this misalignment provides only a small, acceptable amount of variation in the frequency response of the system. In contrast, without the damping of the filter oscillations provided by the active damping control circuit, the poles contributed by the filter inductor are very difficult to cancel. In the undamped case, even slight misalignment between the poles contributed by the inductor and the zeroes contributed by the compensation circuit can result in severe stability problems in the overall frequency response of the system that may lead to ringing or even self-sustaining oscillations.

The present invention is of particular importance in the context of a tracking power supply of an audio amplifier; however, the concept of actively damping the filter and then compensating for the actively damped filter has broader application in any system where the frequency response of the output filter must be stable and flat.

Additionally, the present invention is described herein in the context of a second order conventional filter. The principles of the present invention may be applied to more complex filter using a state variable approach.

DETAILED DESCRIPTION OF THE INVENTION

Figure 1:
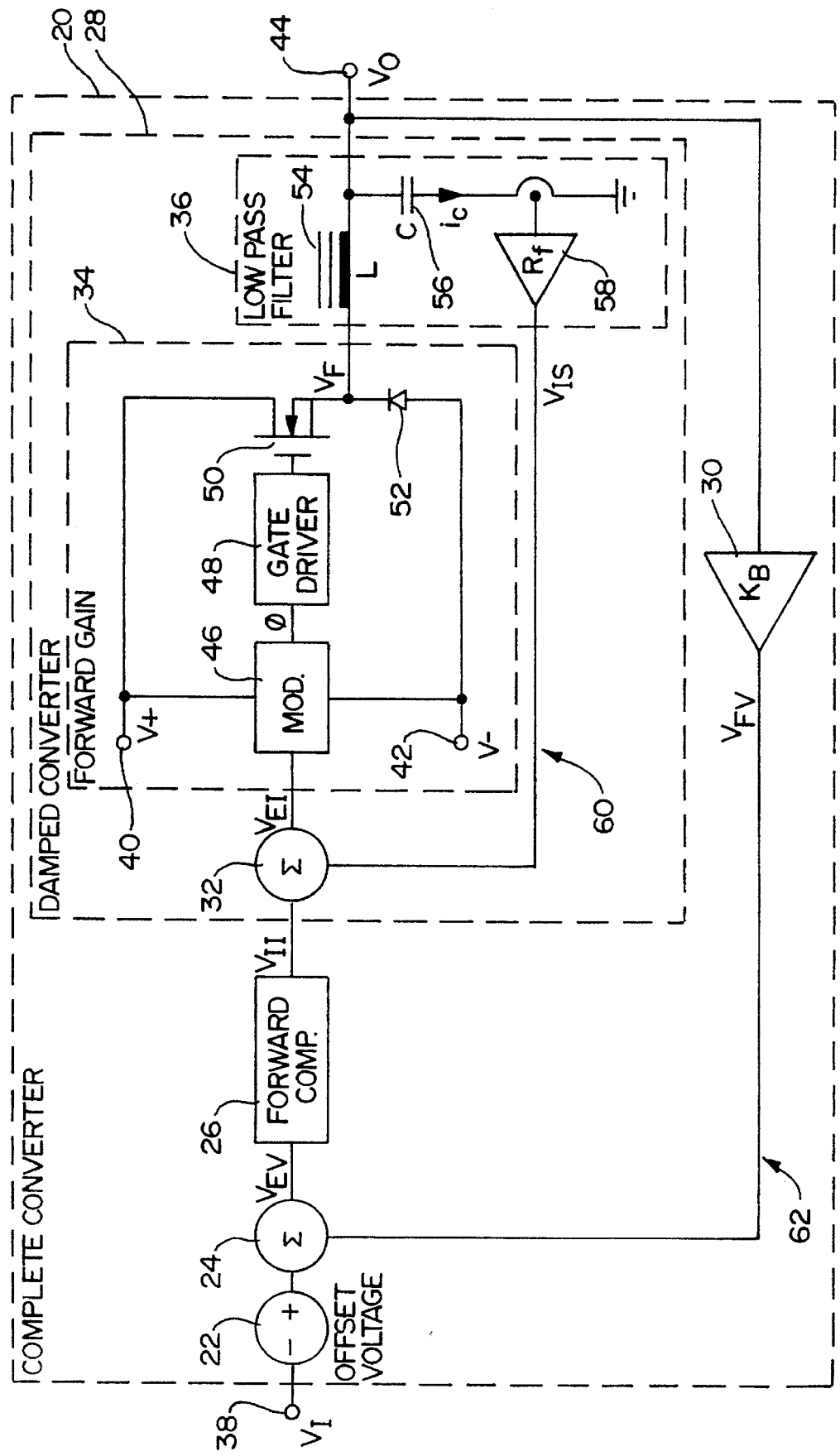
FIG. 1 is a block diagram of a complete converter constructed in accordance with, and embodying, the principles of the present invention.

Referring to the drawing, depicted at 20 in FIG. 1 is a block diagram of an exemplary complete converter constructed in accordance with, and embodying, the principles of the present invention.

The complete converter 20 basically comprises an offset circuit 22, a first summer 24, a forward compensator block 26, a damped converter block 28, and a unity gain feedback amplifier 30. The damped converter block 28 itself basically comprises a second summer 32, a forward gain block 34, and a low pass filter 36. An input voltage $V_I$, a positive raw supply voltage V+, and a negative raw supply voltage V− are present at input terminals 38, 40, and 42, respectively, while an output voltage $V_O$ is present at an output terminal 44.

The offset circuit 22 in the exemplary complete converter 20 is set to provide a positive predetermined voltage offset to the input voltage $V_I$ in situations where the converter is used as part of a rail-to-rail tracking power supply. In other situations this voltage offset can be set to zero, or the offset circuit eliminated.

The forward gain block 34 comprises a modulator circuit 46, a gate driver circuit 48, a gate 50, and a freewheeling diode 52. The input to the forward gain circuit 34 is a current damping loop error voltage $V_{EI}$. Based on the error voltage $V_{EI}$, the modular circuit 46 opens and closes the gate 50 through the gate driver circuit 48 to obtain a low pass filter input voltage $V_F$.

The low pass filter 36 comprises an output inductor 54, and output capacitor 56, and an instrumentation amplifier 58. High frequency components of the low pass filter input voltage $V_F$ generated by the forward gain block are removed by the low pass filter 36 to obtain the output voltage $V_O$. The instrumentation amplifier 58 generates a current damping loop feedback voltage $V_{IS}$ indicative of the resonant current within the output capacitor 56; the second summer 32 adds the current damping loop feedback voltage $V_{IS}$ to a current damping loop input signal $V_{II}$ to obtain the current damping loop error voltage $V_{EI}$.

The feedback amplifier 30 generated a voltage loop feedback voltage $V_{FV}$ based on the output voltage low pass filter input voltage. The first summer 24 adds the voltage loop feedback voltage $V_{FV}$ to the input voltage $V_I$ to obtain a voltage loop error voltage $V_{EV}$. This voltage loop error voltage $V_{EV}$ iS passed through the forward compensation block 26 to obtain the current damping loop input voltage $V_{II}$.

Accordingly, the complete converter 20 as shown in FIG. 1 basically comprises two feedback loops: (a) an inner or secondary loop 60 including the forward gain block 34, the low pass filter 36, and the second summer 32; and (b) an outer or primary loop 62 including the forward compensator block 26, the damped converter block 28, and the feedback amplifier 30.

The inner feedback loop 60 varies the current damping loop error voltage $V_{EI}$ based on the resonant current flowing through the output capacitor 56 to actively damp oscillation within the filter 36. Stated alternatively, the output filter 36 contributes two poles that lie in the left half of the s-plane; these poles are spaced above and below the σ-axis adjacent to the jω-axis. The active damping introduced by the inner feedback loop 60 causes the poles contributed by the filter 36 to move away from the right half of the s-plane onto the σ-axis. The resulting damped converter 28 thus contributes two poles that lie well within the left half of the s-plane on the σ-axis. Without this active damping, the frequency response of the low pass filter 36 results in loop instability because the resonant frequency of the output inductor 54 is relatively close to the highest frequency of interest.

The forward compensator block 26 in the outer feedback loop compensates for the frequency response of the damped converter block 28. More particularly, the forward compensator block 26 results in a zero being placed on top of each of the two poles contributed by the damped converter 28 as described above. Since the two poles contributed by the damped converter 28 lie on the σ-axis, the two zeros contributed by the forward compensator block need not be exactly aligned with the two poles contributed by the converter 28; any slight misalignment between these poles and zeros will result in a slight but acceptable variation in frequency response within the frequency range of interest.

The outer feedback loop 62 is constructed in a conventional manner such that the modulator circuit 46 varies the widths of the pulses that form the low pass filter input voltage $V_F$ to cause the output voltage $V_O$ to track the input voltage $V_I$. The feedback amplifier 30 contributes a single zero on the σ-axis at or near the origin. Because of the offset provided by the offset circuit 22, the output voltage $V_O$ will thus track the input voltage $V_I$ but will be offset above the input voltage by the predetermined voltage offset.

As the poles contributed by the filter 36 have been actively damped by the inner loop 60 and cancelled by the zeros contributed by the forward compensator block 26, the transfer function of the complete converter 20 thus comprises a single zero at or near the origin, resulting in an essentially flat frequency response within the frequency range of interest.

Figure 2:
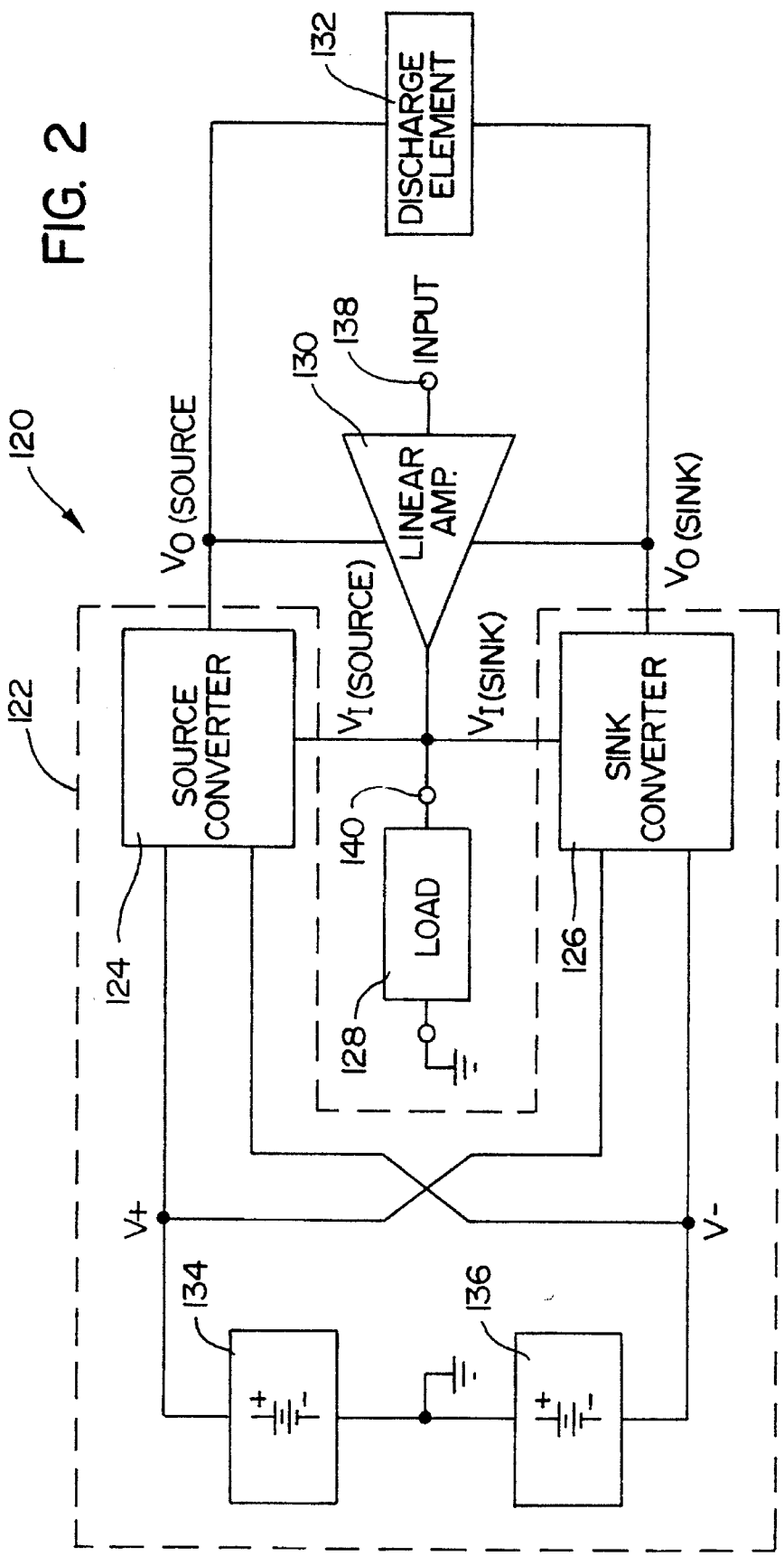
FIG. 2 is a block diagram of an audio amplifier employing a converter such as that depicted in FIG. 1.

Referring now to FIG. 2, a typical operating environment of the complete converter 120 will be described in further detail. Depicted at 120 in FIG. 2 is an exemplary amplifier having a power supply 122 incorporating source and sink converters 122 and 124. The source converter 122 is formed by the complete converter 20 shown in FIG. 2; the sink converter 122 is in all respects the same as the complete converter 20 except that: (a) the positions of the gate 50 and freewheeling diode 52 are exchanged; and (b) the offset circuit 22 is set to provide a negative predetermined offset voltage to the input voltage $V_I$. The positive and negative predetermined offset voltages will usually, although not necessarily, be the same.

The amplifier 120 drives a load 128 and further comprises a linear amplifier 130 and a discharge element 132. The power supply 122 further comprises conventional positive and negative direct current power sources 134 and 136. The linear amplifier 130 is a conventional class AB amplifier comprising a pair of transistors arranged in a push-pull configuration. The discharge element 132 is connected across the linear amplifier 130 to discharge the output capacitors within the source and sink converters 124 and 126 and thus reduce floating of these signals. Examples of the linear amplifier 130, discharge element 132, and direct current power sources 134 and 136 were discussed in detail in the Applicants' copending U.S. patent application Ser. No. 08/154,739, which is incorporated herein by reference.

The signal names employed above with reference to FIG. 1 will be used consistently in the following discussion of FIG. 2, with further definition being provided when necessary to distinguish between signals associated with the source converter 124 and the sink converter 126. The positive raw supply signals V+ and V− described above are generated by the positive and negative direct current power sources 134 and 136, respectively.

As shown in FIG. 2, a signal INPUT is applied to an input terminal 138 of the linear amplifier 130. A signal OUTPUT generated by the linear amplifier 130 is present at an output terminal 140. The OUTPUT signal is used as the input voltage $V_{I\,(SOURCE)}$ and $V_{I(SINK)}$ to the source and sink converters 124 and 126. As the output voltages $V_{O\,(SOURCE)}$ and $V_{O\,(SINK)}$ of the converters 124 and 126 will track, with offset, the signals $V_{I(SOURCE)}$ and $V_{O(SINK)}$ input thereto, these output voltages $V_{O(SOURCE)}$ and $V_{O(SINK)}$ will track the OUTPUT signal but will be offset above and below the OUTPUT signal by the positive and negative predetermined offset voltage.

Figure 3:
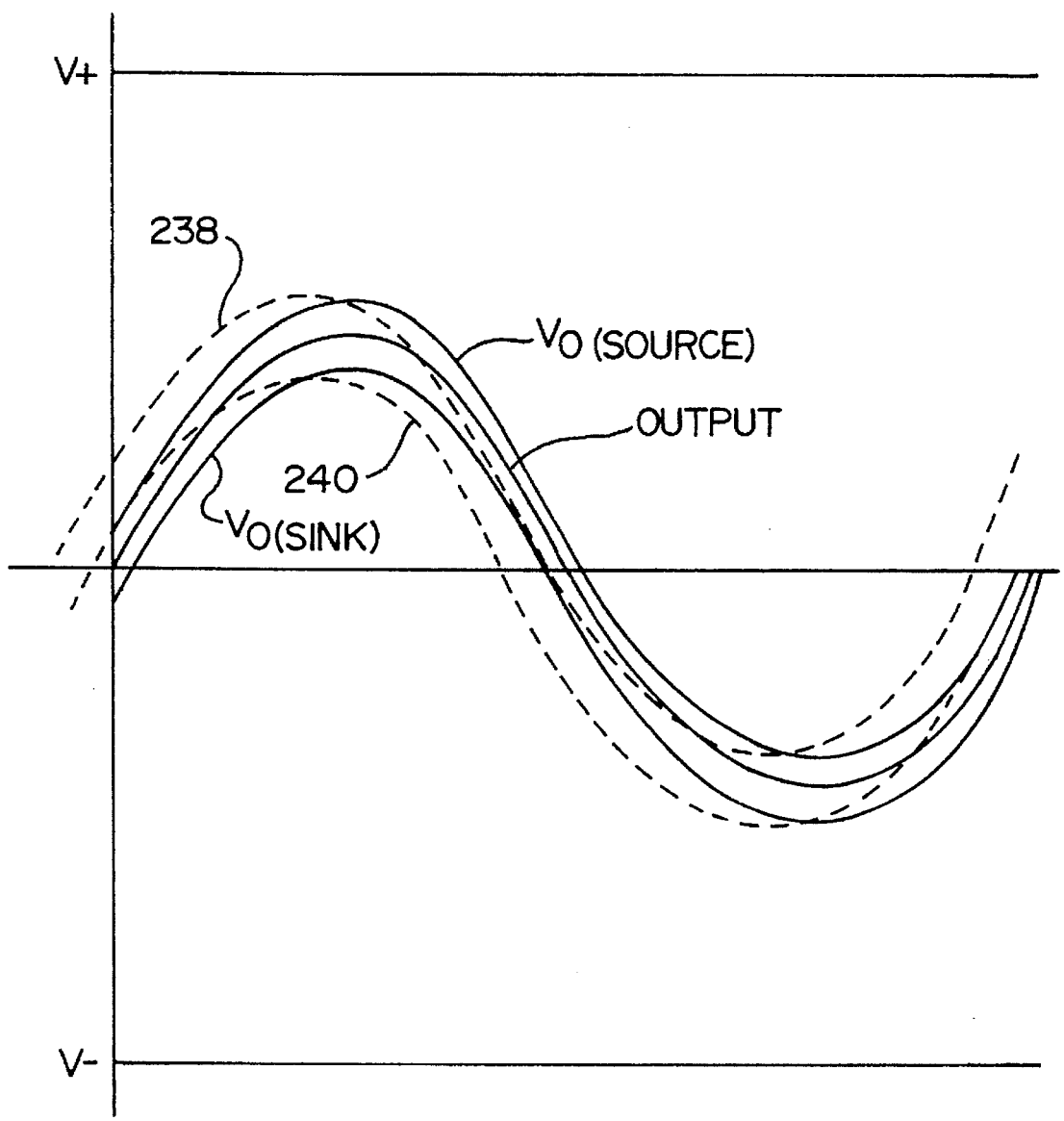
FIG. 3 depicts exemplary waveforms associated with the block audio amplifier shown is FIG. 2.

FIG. 3 depicts the relationships of the signals V+, V−, $V_{O(SOURCE)}$, VO(SINK), and OUTPUT. The discharge element 132 maintains the difference between the signals $V_{O(SOURCE)}$ and $V_{O(SINK)}$ and the converter circuits 124 and 126 containing the actively damped and forward compensated filter 36 ensure that no phase shift occurs between the signals $V_{O(SOURCE)}$ and OUTPUT or between the signals $V_{O(SINK)}$ and OUTPUT with the frequency range of interest. The elimination of floating and phase shift ensures that the proper voltage drop is present across the linear amplifier 130 to allow this amplifier 130 to function properly.

The theory of operation of the complete converter 20 shown in FIG. 1 will now be explained in further detail with reference to FIGS. 4–12.

FIGS. 4–10 show the transfer functions in the frequency domain and pole-zero diagrams for the complete converter 20 and various components and sub-components thereof. FIGS. 11 and 12 depict signal flow diagrams representing the damped converter 28 and the complete converter 20, respectively.

Figure 4A:
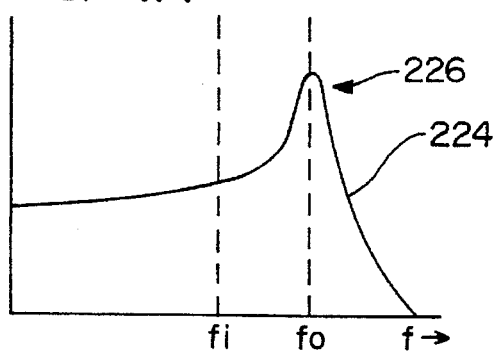
FIGS. 4A, 4B, 5A, 5B, 6a, 6B, 7A, 7B, 8A, 8B, 9A, 9B, 10A and 10B depict transfer function curves and pole-zero diagrams for the complete converter shown in FIG. 1 and various components thereof.
Figure 4B:
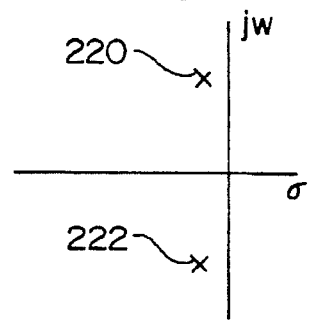

FIGS. 4A and 4B depict the operating characteristics of the low pass filter 36. As shown, this filter 36 contributes two poles 220 and 222 (FIG. 4B) which result in a frequency response curve 224 thereof having a peak in the frequency domain at a resonant frequency $f_o$ (FIG. 4B). The resonant frequency $f_o$ is determined by the characteristics of the inductor 54. The transfer function $T_{LP}$ and admittance $Y_F$ of the filter 36 are set forth in the following equations (1) and (2), respectively:

$$T_{LP} = \frac{X_C}{X_C + X_L} \qquad \text{Equation (1)}$$

$$Y_F = \frac{1}{X_C + X_L} \qquad \text{Equation (2)}$$

Figure 5A:
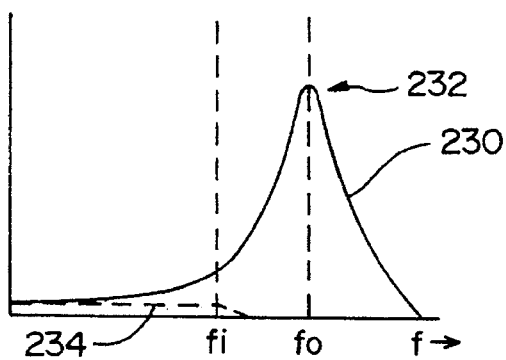
Figure 5B:
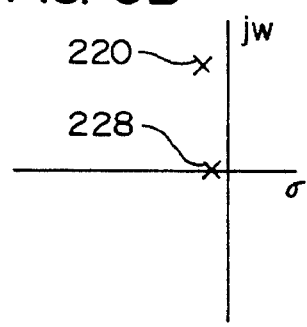

The situation in which the filter 36 is included undamped and uncompensated for in a feedback loop is depicted in FIGS. 5A and 5B. The feedback loop adds a pole 228 at or near the origin. The frequency response curve 230 of the undamped and uncompensated for filter within a feedback loop contains a peak 232 in the frequency domain at the resonant frequency $f_o$ The highest frequency of interest is indicated at $f_i$ in the FIG. 4A–12A. In an audio amplifier, the highest frequency of interest is normally 20 kHz. So that the audio signal may be tracked accurately, the inductor 54 is selected such that its resonant frequency $f_o$ is approximately 60–100 kHz. Accordingly, the resonant frequency $f_o$ is relatively close to the highest frequency of interest $f_i$ and must be that way if the converters 124 and 126 art to track accurately.

This arrangement described in relation to FIGS. 5A and 5B results in a significant deviation at the highest frequency of interest $f_i$ between the actual frequency response curve and the desired frequency response curve indicated by dashed lines at 234; this deviation is shown at 236 in FIG.

5A and results in unacceptable phase shift in the tracking signal at the output of the filter 36. As shown by dotted lines 238 and 240 in FIG. 3, shifting the phase of the converter output voltages $V_{O(SOURCE)}$ and $V_{I(SINK)}$ can result in these signals crossing over the audio signal being amplified. Such phase shift will thus prevent proper operation of the linear amplifier 130.

Figure 6A:
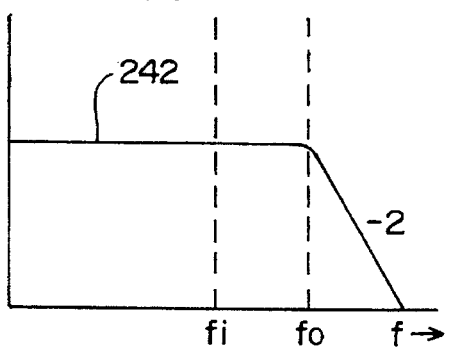
Figure 6B:
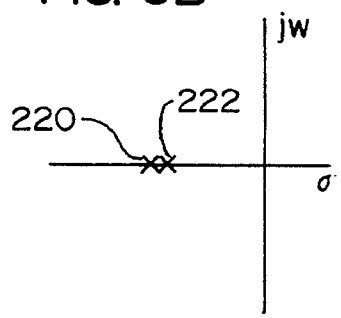

The inner feedback loop 60 described above actively damps the oscillations at the resonant frequency $f_o$ and results in the damped converter 28 having a frequency response curve 242 as depicted in FIG. 6A. This frequency response curve 242 is flat out to the resonant frequency $f_o$, at which point it drops with a slope of −2. As shown in FIG. 6B and described in detail below, this active damping effectively moves the two poles 220 and 222 contributed by the filter 36 away from the right half of the s-plane and onto the σ-axis.

Figure 11A:
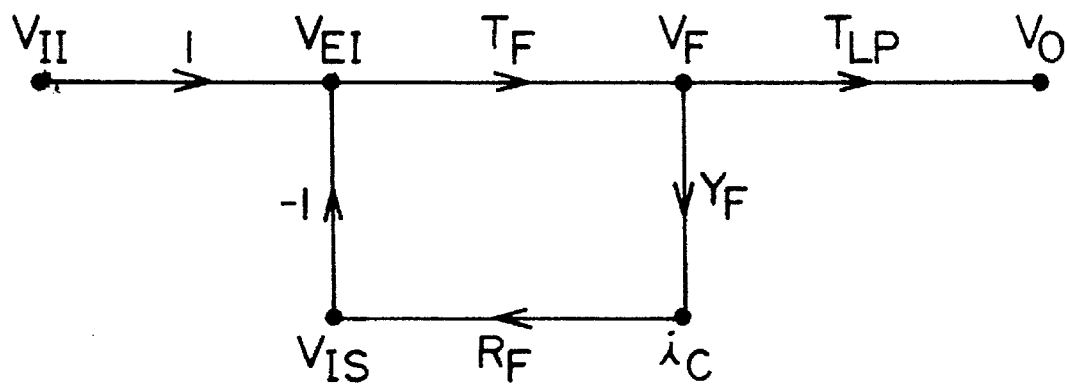
FIGS. 11A, 11B, 11C, 11D, 12A, 12B, 12C and 12D contain signal flow diagrams for the complete converter shown in FIG. 1 and a damped converter component thereof.
Figure 11B:
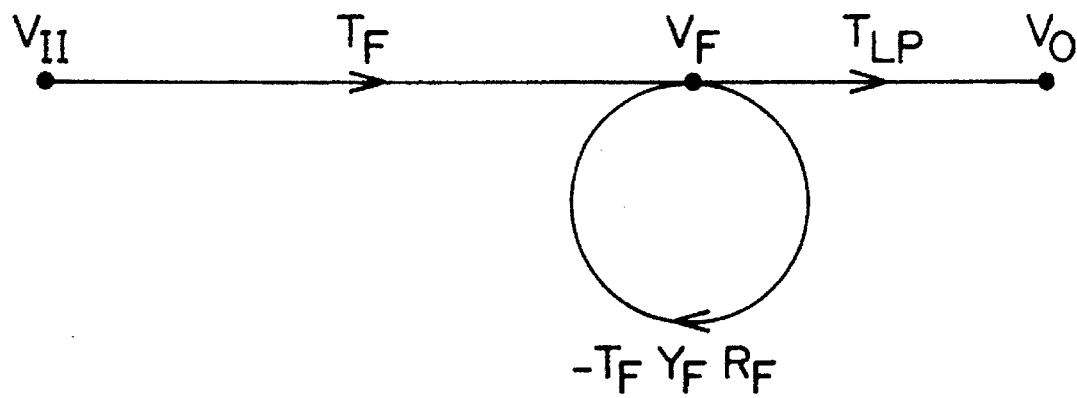
Figure 11C:
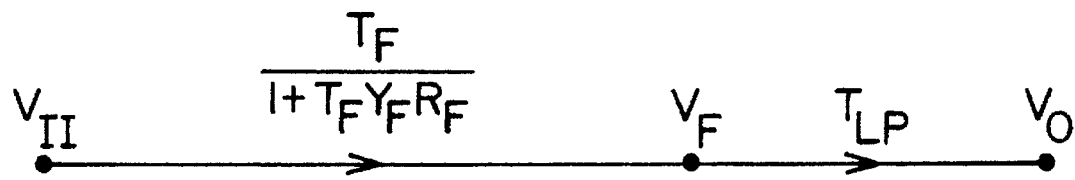
Figure 11D:
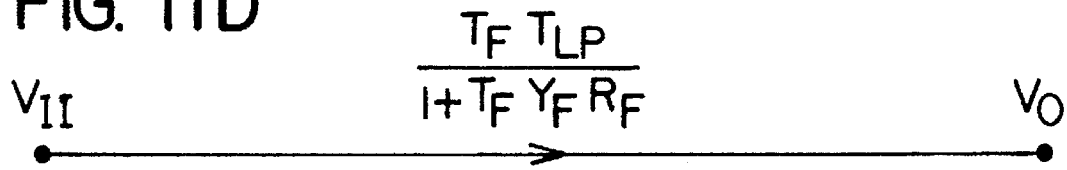

Referring for a moment to FIG. 11A, depicted therein is a signal flow diagram representing the damped converter 28. This diagram may be simplified as shown in FIGS. 11B–D to obtain the following Equation (1):

$$V_O/V_{II} = \frac{T_F T_{LP}}{1 + T_{FY} F_{RF}} \quad \text{Equation (3)}$$

Given Equations (1) and (2) above, Equation (3) can be solved to obtain the damped converter gain $T_{DC}$:

$$T_{DC} = \frac{T_F}{LCs^2 + T_F R_F Cs + 1} \quad \text{Equation (4)}$$

With $$R_F = \frac{1}{T_F} \sqrt{L/C} \quad \text{Equation (5)}$$

we have critical damping, and the gain $T_{DC}$ of the damped converter becomes $$T_{DC} = \frac{T_F}{(s/\omega_o + 1)^2} \quad \text{Equation (6)}$$

Once the filter has been damped as just described, the forward compensator 26 can be provided to the system. The gain $T_{FC}$ of the forward compensator block 26 is as follows:

$$T_{FC} = \frac{K_F(s/\omega_o = 1)^2}{s} \quad \text{Equation (7)}$$

Figure 7A:
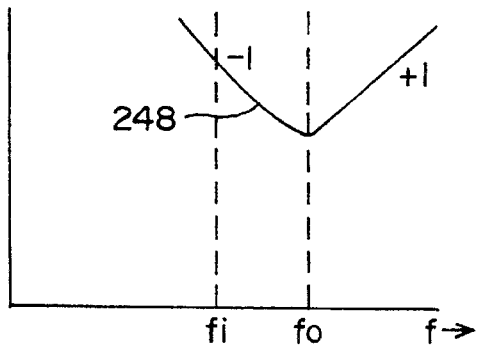
Figure 7B:
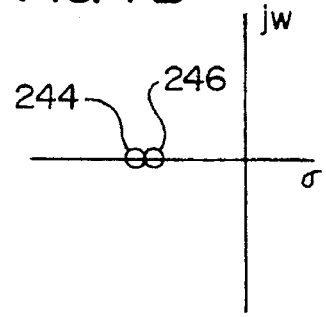

Accordingly, as shown in FIG. 7B, the forward compensator block 26 contributes two zeroes 244 and 246 on the σ-axis that coincide with the two poles 220 and 222 contributed by the damped converter 28. The frequency response curve of the forward compensator block 26 is shown at 248 in FIG. 7A. This frequency response curve has a slope of −1 below the resonant frequency $f_o$ and a slope of +1 above the resonant frequency $f_o$.

Figure 8A:
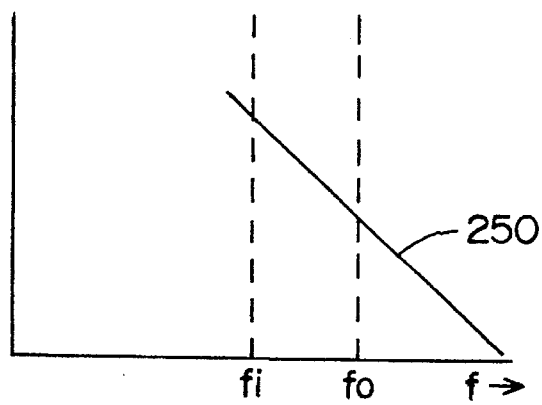
Figure 8B:
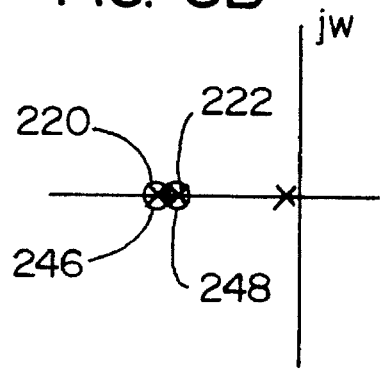

The frequency response curve of the forward compensator block 26 and the damped converter 28 together is shown at 250 in FIG. 8A. The slope of the frequency response curve 250 is −1. As shown in FIG. 8B, the zeroes 246 and 248 cancel the poles 220 and 222. As will be explained in detail below, the zeroes 246 and 248 may be slightly misaligned with the poles 246 and 248 without adversely affecting the output of the complete converter 20.

Figure 12A:
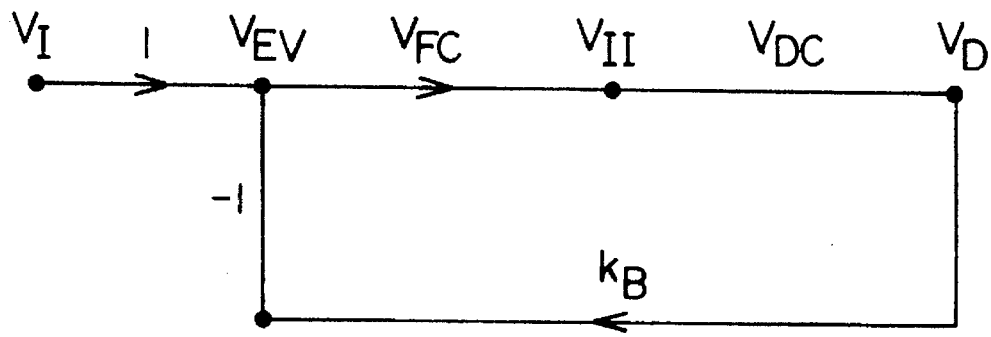
Figure 12B:
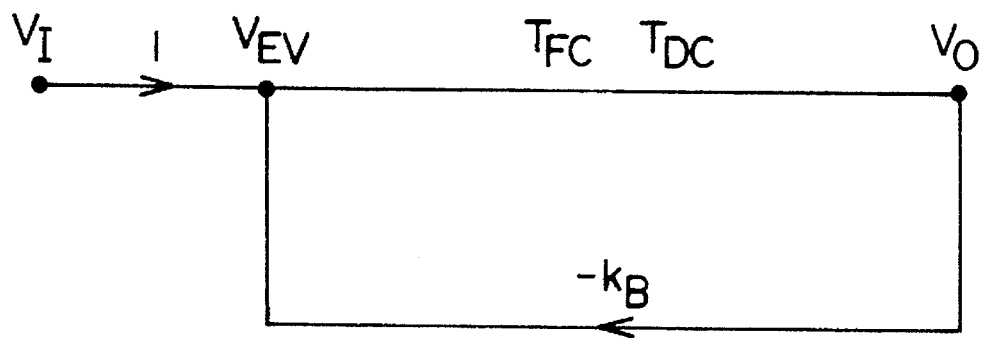
Figure 12C:
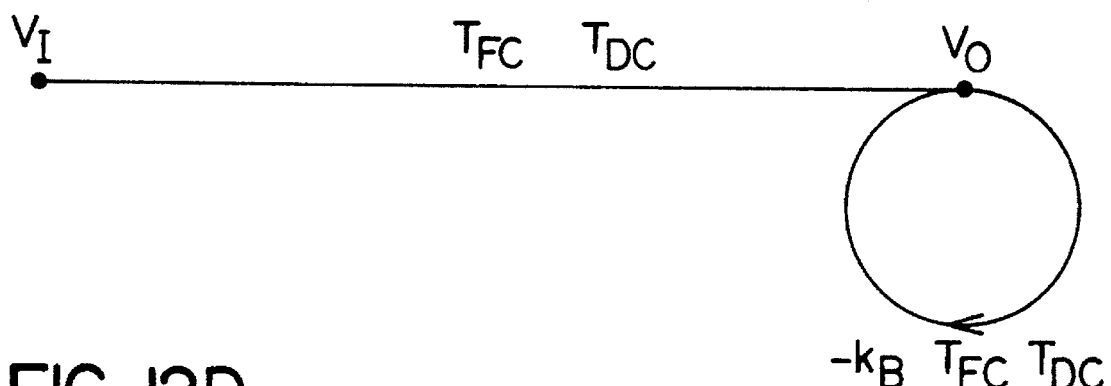
Figure 12D:
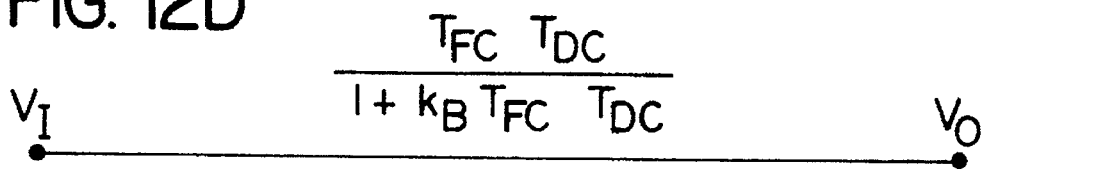

Integrating the forward compensator 26 and damped converter 28 together into the complete converter 20 results in the signal flow diagram shown in FIG. 12A. By simplifying the diagram in FIG. 12A as shown in FIGS. 12B–D, the following equation (8) is obtained:

$$V_O/V_I = \frac{T_{FC} T_{DC}}{1 + k_B T_{FC} T_{DC}} \quad \text{Equation (8)}$$

By substituting into equation (8) the gain $T_{FC}$ of the forward compensator 26 (equation 7) and the gain $T_{DC}$ of the damped converter 28 (equation 6) and simplifying, we obtain the following Equation (9) defining the gain $T_{CC}$ of the complete converter 20:

$$T_{CC} = \frac{1}{C} \cdot \frac{k_B k_{FT} F}{1 + s/k_B k_F T_F} \quad \text{Equation (9)}$$

It should be recognized that the damped converter has a gain of $1/k_B$ and a bandwidth $\omega_C$ of $1/k_B k_F T_F$. The application of the completer converter 20 into the signal tracking power supply 122 of the audio amplifier 120 requires a gain of 1. Therefore, $k_B=1$ and $\omega_C=1/k_F T F$.

Figure 9A:
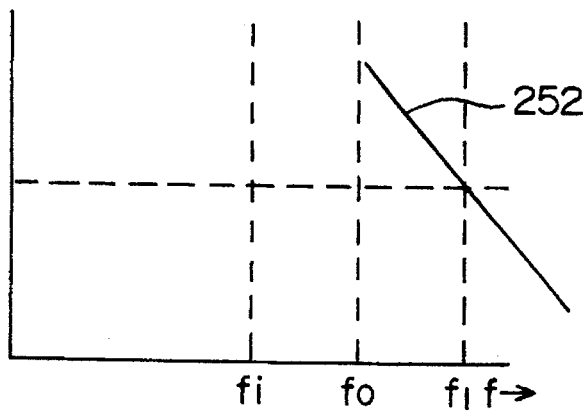
Figure 9B:
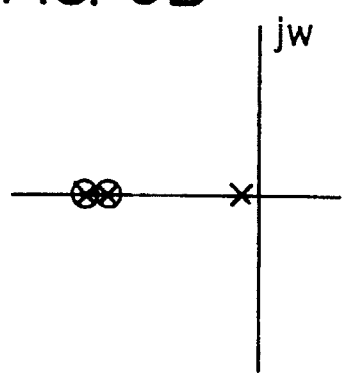
Figure 10A:
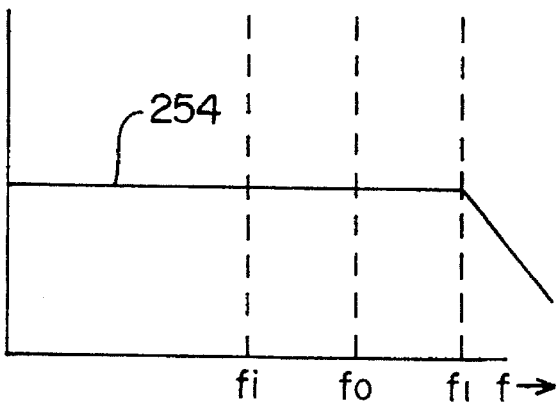
Figure 10B:
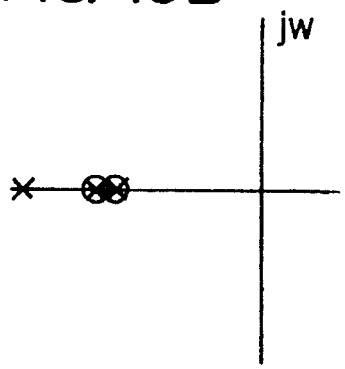

FIG. 9A depicts the open loop frequency response curve 252 of the complete converter 20, while FIG. 10A depicts the closed loop frequency response curve 254 of the complete converter 20. The open loop frequency response curve 252 has a slope of −1 and a magnitude of 1 at a roll-off frequency $f_1$. When the loop is closed, the frequency response curve 254 is flat with unity gain out to the roll-off frequency $f_1$, at which point the curve 254 has a slope of −1.

If the zeroes 244 and 246 are slightly misaligned with the poles 220 and 222, the frequency response curve 254 may have a perturbation at the resonant frequency $f_o$; however, this perturbation will be slight and is insignificant below the highest frequency of interest $f_i$. The result is that the frequency response of the complete converter will be flat within the entire frequency range of interest, resulting in little or no phase shift even near the highest frequency of interest.

Figure 14:
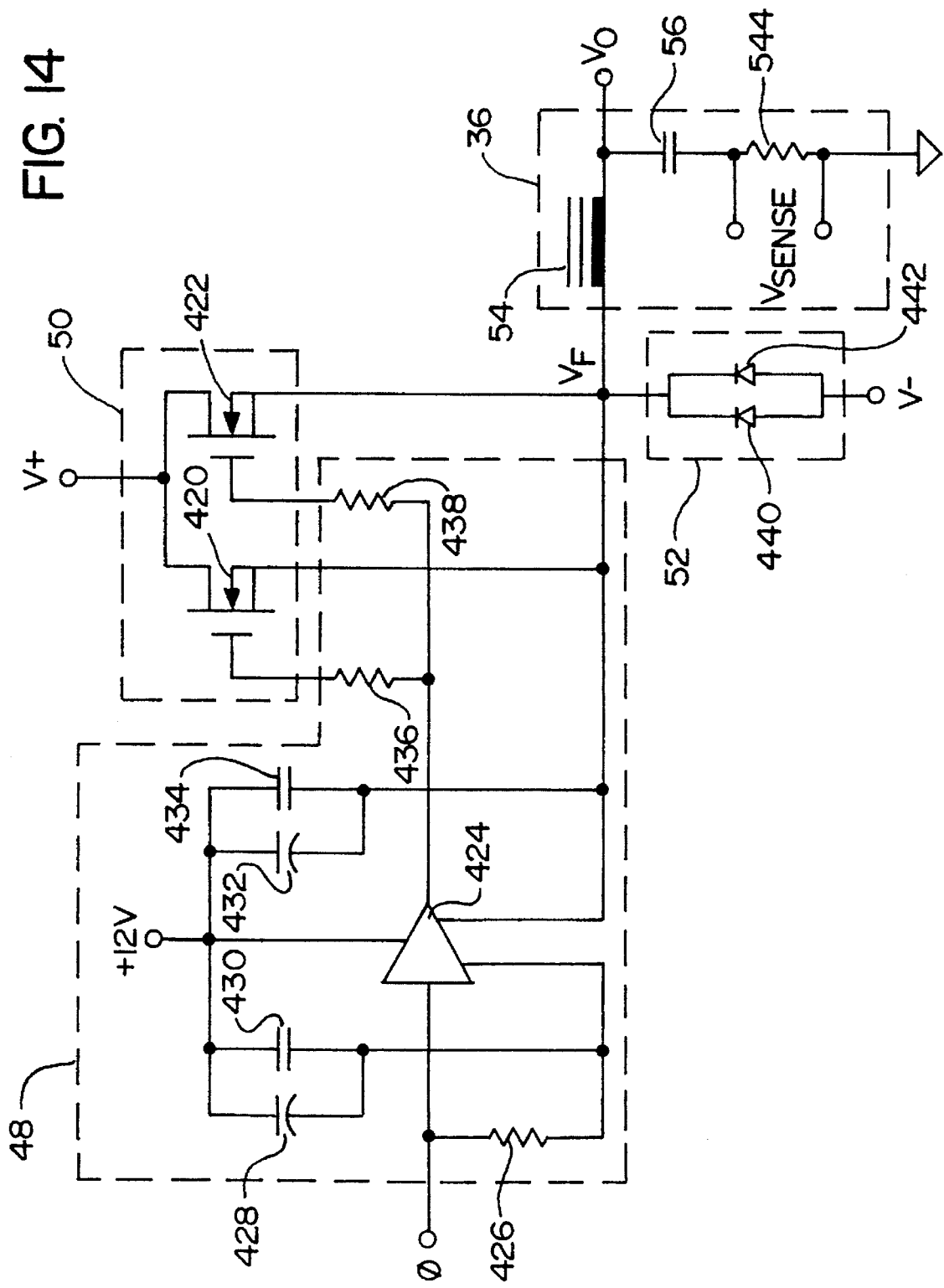
Figure 15:
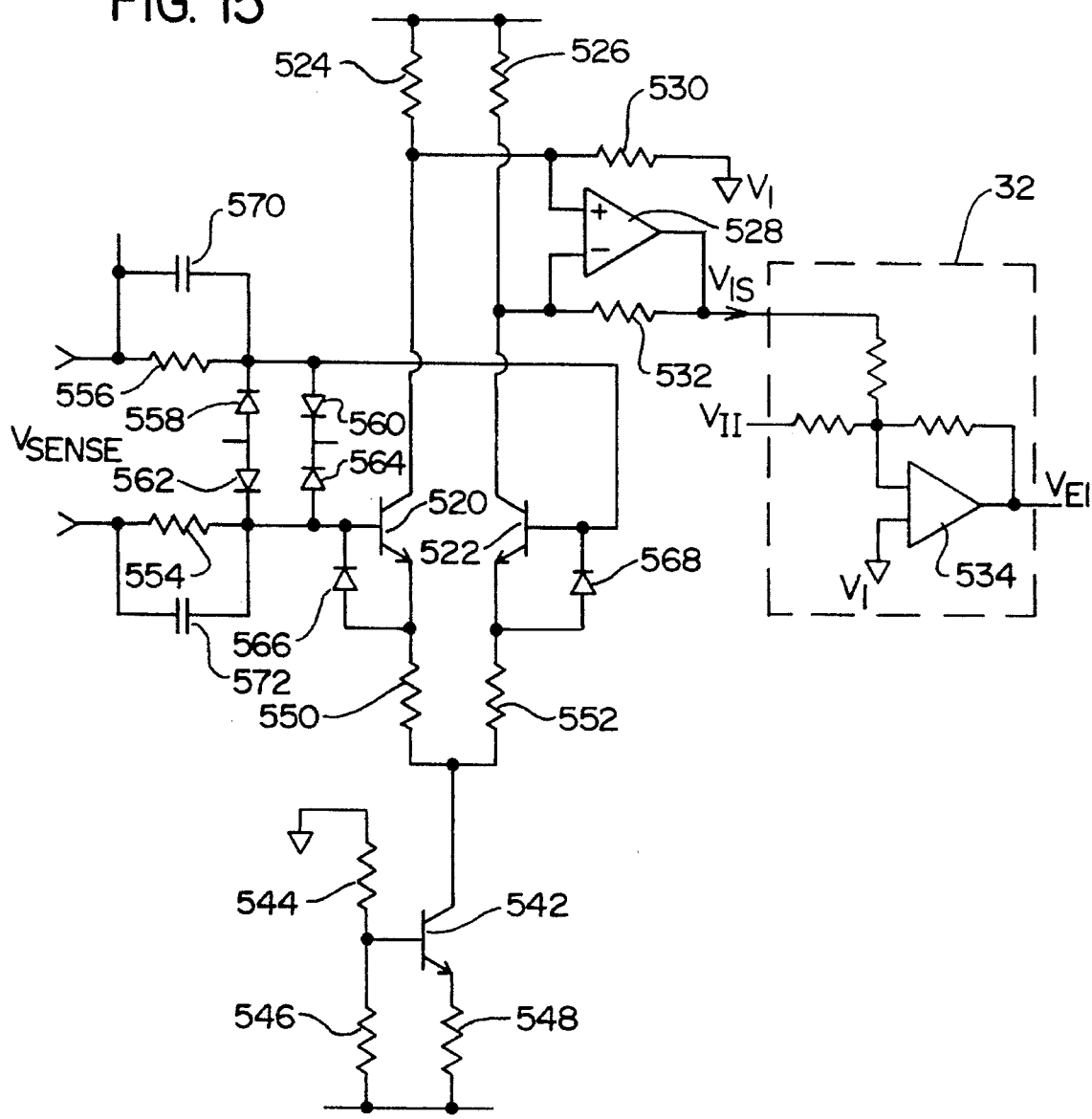
Figure 16:
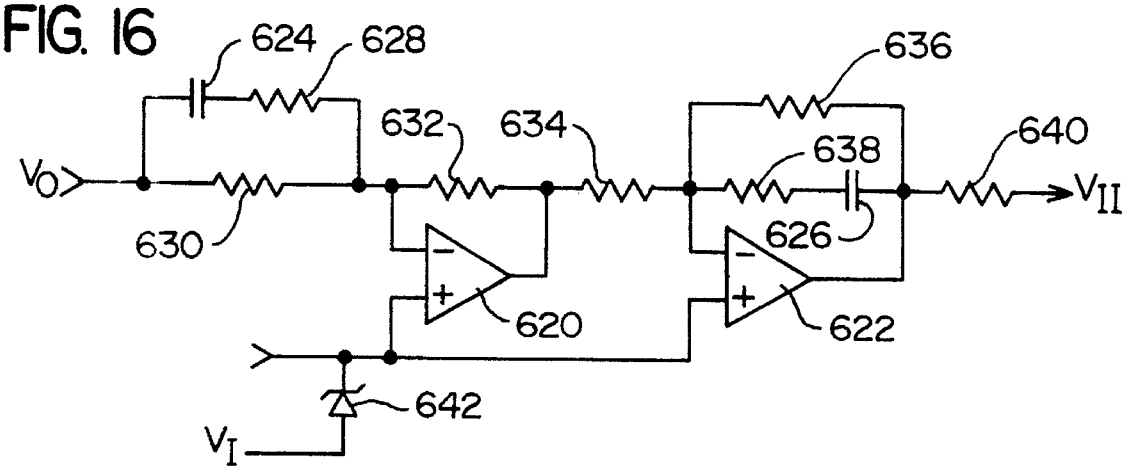

Referring now to FIGS. 13–16, the details of construction of the exemplary complete converter 20 will be described. The modulator block 46 is depicted in detail in FIG. 13. The gate driver 48, gate 50, freewheeling diode 52, and low pass filter 36 are depicted in detail in FIG. 14. The forward compensator 26 is described in further detail in FIG. 15. FIG. 16 depicts the transfer function of the forward compensator 26 in further detail.

Figure 13:
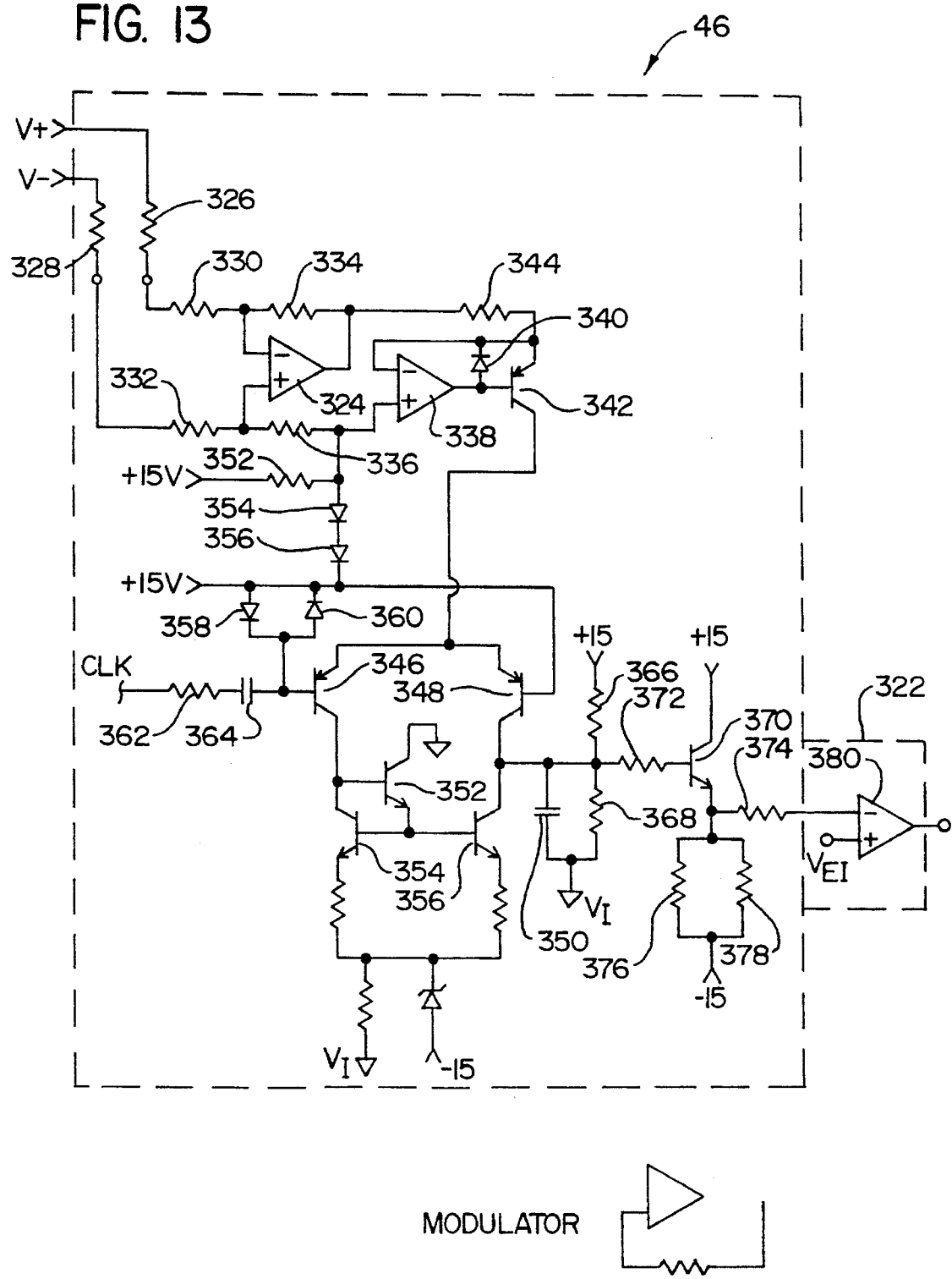
FIG. 13, 14, 15 and 16 contain a schematic diagram depicting circuitry used to implement the block diagram shown in FIG. 1.

Referring initially to FIG. 13, the modulator block 46 basically comprises a triangle generator 320 and a comparator circuit 322. The triangle generator 320 generates a triangle wave signal the amplitude of which varies in proportion to the difference between the raw supply voltages V+ and V−. Under heavy loads, these voltages V+ and V− tend to droop. Unless compensated for, this droop will cause a deviation in the gain of the inner loop 60 that will result in the loop becoming unstable. By varying the amplitude of the triangle wave, the triangle generator 320 compensates for the droop of the raw supply voltages V+ and V− and thereby maintains the gain of the inner loop 60 at 1.

The triangle generator 320 operates basically as follows. An amplifier 324 and its associated resistors 326–336 generate a voltage signal that is a scaled down version of the differential voltage between the raw supply voltages V+ and V−. Based on the output of the amplifier 324, an amplifier 338, diode 340, transistor 342, and resistor 344 generate a current signal that is also proportional to the differential voltage between the raw supply signals V+ and V−.

A clock signal CLK opens and closes transistors 346 and 348 alternately; when the transistor 348 is opened, the current signal generated at the emitter of the transistor 342 charges a capacitor 350; when the transistor 346 is opened, transistors 352, 354, and 356 are operated to provide a path for discharging the capacitor 350. Accordingly, the voltage across the capacitor 350 forms the triangle wave signal discussed above.

The rate at which the capacitor 350 is charged and discharged is determined by the amplitude of the current signal generated by the transistor 342. The charge/discharge rate of the capacitor 350 determines the amplitude of the triangle signal developed thereacross. Thus, the amplitude of the triangle voltage signal developed across the capacitor 350 varies in proportion to the differential voltage between the raw supply voltages V+ and V−.

The remaining components shown in FIG. 13 facilitate the operation of the components described above and will be discussed herein only briefly. A resistor 241 and diodes 354 and 356 shift the voltage applied to the bases of the transistors 346 and 348 to an appropriate level. Diodes 358 and 360 form a clamp that limits the differential voltages across the resistors 346 and 348. A resistor 362 limits input current, and a capacitor 364 eliminates DC offset. Resistors 366 and 368 set the center of the triangle wave and prevent floating. A transistor 370 is configured as an emitter-follower to obtain a low output impedance. Resistors 372 and 374 damp parasitic oscillations, and resistors 376 and 378 set the quiescent current of the transistor 370.

The triangle voltage signal generated by the triangle generator 320 is applied to a—terminal of comparator 380. The current damping loop error voltage $V_{EI}$ is applied to the negative terminal of the comparator 380. The output of the comparator 380 is a pulse-width modulated drive signal $\phi$, where the widths of the pulses that comprise the drive signal $\phi$ varies based on the magnitude of the current damping loop error voltage $V_{EI}$.

As shown in FIG. 14, the drive signal $\phi$ turns ON and OFF MOSFETs 420 and 422 through the gate driver 48. These MOSFETs 420 and 424 are arranged in parallel to form the gate 50. The number of MOSFETs employed depends upon the power rating of the amplifier in which the complete converter 20 is used.

The drive signal $\phi$ is applied to the gate drive circuit 48. In particular, the gate drive circuit 48 comprises a gate driver 424, a resistor 426, and capacitors 428, 430, 432, and 434. The gate driver 424 provides the gate drive voltage and current necessary to turn ON and OFF the MOSFETs 420 and 422 that form the gate 50. The resistor 548 forces the driver 424 to generate to run the MOSFETs 420 and 422 OFF should an open circuit occur across the gate driver 424. The capacitors 428–434 are supply bypass capacitors that provide a low impedance path to ground for any high frequency signals present on the supply voltage for the gate driver 424. A resistor 436 is provided for the MOSFET 420 and a resistor 438 is provided for the MOSFET 422 to damp parasitic oscillations.

FIG. 14 further depicts that the freewheeling diode 52 can actually comprise two diodes 440 and 442 in parallel depending upon the power rating of the amplifier.

A current sense resistor 544 is provided in series with the output capacitor 56. A voltage $V_{SENSE}$ developed across the sense resistor 544 is proportional to the current through the output capacitor 56.

Referring now to FIG. 15, shown in detail therein is the instrumentation amplifier 58. The instrumentation amplifier 58 generates a voltage $V_{IS}$ at its output based on the voltage $V_{SENSE}$ at its input. In particular, the voltage $V_{SENSE}$ is applied across transistors 520 and 522; these transistors 520 and 522 form a differential transconductor that causes differential output currents to flow through resistors 524 and 526. These differential output currents are proportional to the differential voltage $V_{SENSE}$. An amplifier 528 and its associated resistors 530 and 532 converts the differential output currents into the current damping loop feedback voltage $V_{IS}$. So obtained, the current damping loop feedback voltage $V_{IS}$ is proportional to the resonant current flowing through the output capacitor 56.

The current damping loop feedback voltage $V_{IS}$ is applied to one input of an operational amplifier 534. This operational amplifier 534 and it associated resistors 536, 538, and 540 form the second summer 32.

The remaining components shown in FIG. 15 facilitate the operation of the components described above and will be described herein only briefly. Transistor 542 and resistors 544, 546, and 548 form a current source to bias the resistors 520 and 522. Resistors 550 and 552 provide local degeneration. Resistors 554 and 556 and diodes 558–568 provide over voltage protection. Capacitors 570 and 572 allow high frequency signals to bypass the resistors 554 and 556.

The forward compensator 26 will now be explained in further detail with reference to FIG. 16. The compensator 26 comprises first and second operational amplifiers 620 and 622, first and second capacitors 624 and 626, and first through seventh resistors 628–640. Also shown in FIG. 16 is a zener diode 642 that forms the offset circuit 22. It should also be noted that the function of the first adder 24 is inherent in the operation of the exemplary compensator 26 shown in FIG. 16.

Perhaps the best way to explain the operation of the circuit shown in FIG. 16 is by referencing the elements thereof to corresponding portions of the transfer function thereof. The transfer function for the circuit shown in FIG. 16 is shown in FIG. 17.

Figure 17:
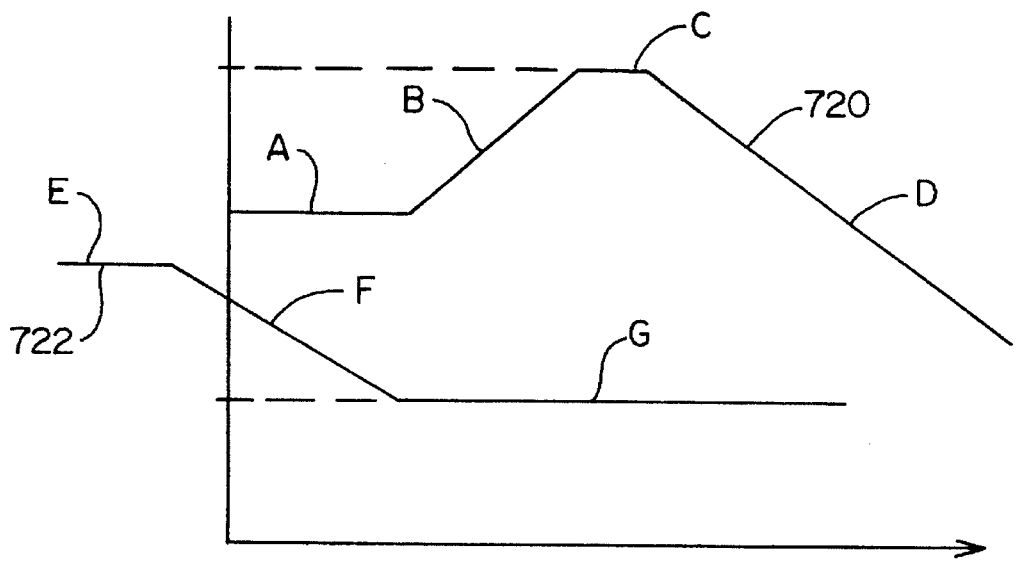
FIG. 17 contains a diagram of the transfer function of the forward compensator of the complete converter shown in FIG. 1.

In particular, FIG. 17 shows that the overall frequency response curve of the compensator 26 as shown at 248 in FIG. 7A is actually comprised of two separate curves 720 and 722. The first curve 720 is associated with the op amp 620 and is comprised of segments A, B, C and D, while the second curve 722 is associated with the op amp 622 is comprised of segments E, F, and G.

Segments A is contributed by resistors 630 and 632. Segment B is contributed by resistor 632 and capacitor 624. Segment C is contributed by resistors 632 and 628. Segment D is due to the op amp 620 running out of gain at higher frequencies. Segment E is contributed by resistors 634 and 636. Segment F is contributed by resistor 634 and capacitor 626. Segment G is contributed by resistor 628 and resistor 638. It should be noted that the juncture of segments B and C should be a factor of 5 above the loop bandwidth.

Because it is used as a voltage follower, the exemplary complete converter 20 employs two separate and distinct ground referencing schemes to simplify the implementation thereof.

In particular, the first scheme is employed in the block diagrams shown in FIG. 1 and 2. The ground shown in FIGS. 1 and 2 ground is connected to the common or center tap of the main supply. VI, VF, VO, V+, and V− are always referred to this first ground.

The second grounding scheme is employed in the control circuitry and is indicated by a triangle symbol instead of the symbol using three short lines. This second ground is connected to the input, $V_I$. The second summer's input voltages $V_I$ and $V_{FV}$ are referred to the first ground, but its output $V_{EV}$ is referred to the second ground. The subsequent signals $V_{II}$, $V_{EI}$, and $V_{IS}$ are also referred to the second ground.

The use of these two separate grounding schemes is not essential to practice the present invention but significantly simplifies the implementation of the present invention.

Referring again to FIG. 14, depicted therein at 600 is a circuit from which the voltage $V_{SENSE}$ is derived. This circuit 600 comprises the inductor 54 and output capacitor 56 that form the low pass filter portion of the complete converter 20. This circuit 600 further comprises the current sense resistor 544. In the exemplary circuit 600, the voltage $V_{SENSE}$ is developed across the current sense resistor 544, which is in series with the output capacitor 56.

Referring now to FIGS. 18–21, alternative methods for obtaining this voltage $V_{SENSE}$ are depicted.

Figure 18:
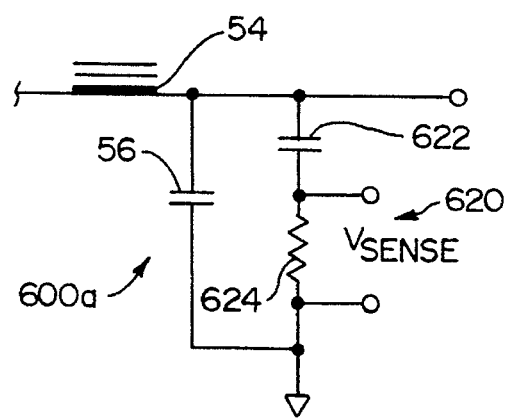
FIGS. 18, 19, 20 and 21 are simplified circuit diagrams showing methods of obtaining signals indicative of the current flow through the output capacitor.

Referring initially to FIG. 18, depicted therein is a circuit 600a for developing the voltage $V_{SENSE}$. This circuit 600a comprises the output inductor 54, the output capacitor 56, and a sampling circuit 620 comprising a sampling capacitor 622 and a sense resistor 624. The sampling capacitor 622 and sense resistor 624 are arranged in series, and the sense circuit 620 formed thereby is arranged in parallel with the output capacitor 56.

The current flowing through the sense circuit 620 is proportional to the current flowing through the output capacitor 56; however, where current flowing through the output capacitor might be 5 amps, the current flowing through the sense circuit 620 might be between 5 and 50 milliamps. Dissipation losses caused by the sense resistor 624 in the circuit 600a will thus be significantly lower than those introduced by the current sense resistor 544 in the circuit 600 described above.

To achieve this reduction in dissipation, the value of the sampling capacitor 622 must be selected in reference to the value of the output capacitor 56 such that the capacitance of the sampling capacitor is much smaller than that of the output capacitor. Also, the circuit 620 must be capacitive at the resonant frequency of the output filter. The ratio of the value of the sampling capacitor 622 to the value of the output capacitor 56 should be in the range of 3:1 to 1000:1. Preferably, this ration will be approximately 100:1.

Figure 19:
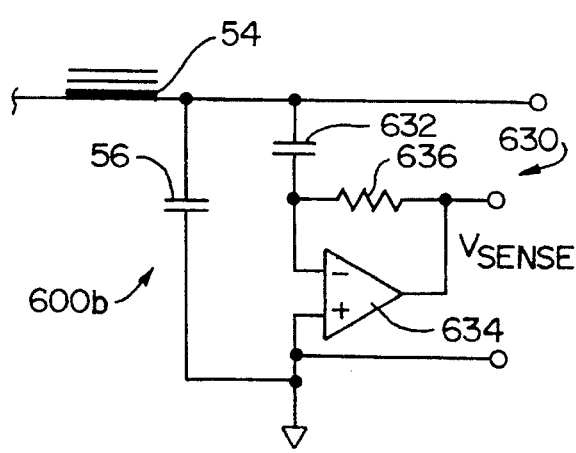

Referring now to FIG. 19, depicted therein at 600b is yet another circuit for obtaining the voltage $V_{SENSE}$. This circuit 600b comprises the output inductor 54, the output capacitor 56, and a sense circuit 630 comprising a sampling capacitor 632, operational amplifier 634, and resistor 636. The sampling capacitor is connected at one side to the juncture between the output filter 54 and output capacitor 56 and at another side to a negative input terminal of the amplifier 634. The resistor 636 is connected between the negative input of the amplifier 634 to the output thereof. The positive input terminal of the amplifier 634 is connected to the grounded terminal of the output capacitor 56. The voltage $V_{SENSE}$ is measured across the output and positive terminals of the amplifier 634.

The sense circuit 630 provides a very low impedance to capacitor 632, resulting in a current flowing through the sampling capacitor 632 of approximately 0.5 to 5 milliamps. This circuit 630 also eliminates a pole introduced by the circuit 600a described above, thereby providing a response that does not roll off at the frequency of interest.

Figure 20:
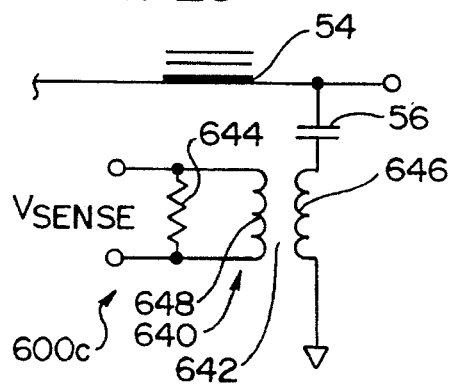

Referring now to FIG. 20, depicted therein at 600c is yet another exemplary circuit for obtaining the voltage $V_{SENSE}$. This circuit 600c comprises the output inductor 54, output capacitor 56, and a sense circuit 640 comprising a current transformer 642 and a sense resistor 644. A primary winding 646 of the current transformer 642 is arranged in series with output capacitor 56. The sense resistor 644 is arranged across the secondary winding 648 of the current transformer 642. The voltage $V_{SENSE}$ is measured across the sense resistor 644.

In comparison with the circuit 600, 600a, and 600b described above, the circuit 600c develops a signal $V_{SENSE}$ that is much larger than the signal $V_{SENSE}$ obtained by the other circuits. This occurs because the resistor 644 may be on the order of 100 ohms instead of on the order of 10 milliohms as in the other circuits employing sense resistors. The turns ratio of the transformer is selected to reduce the voltage drop across its primary winding.

By using a resistor that is relatively large, the circuit 600c eliminates problems with inductance associated with such relatively small resistors. The circuit 600c also isolates the signal $V_{SENSE}$ and allows it to be referred to a reference point other than that of the output filter. Finally, while current transformers can, under some circumstances, be relatively expensive, the current transformer employed in the circuit 600c is easy to make and therefore inexpensive because of the narrow frequency range of interest.

Figure 21:
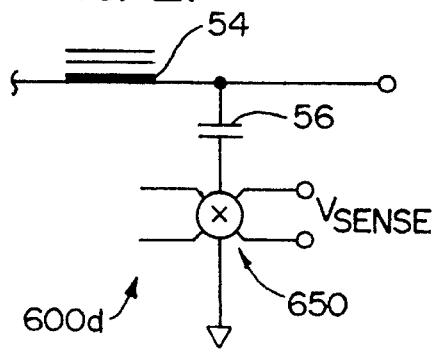

Referring now to FIG. 21, yet another circuit 600d for developing the voltage $V_{SENSE}$. This circuit 600d comprises the output inductor 54, the output capacitor 56, and a hall effect multiplier 650 arranged in series with the output capacitor 56. The hall effect multiplier 650 meters the current passing through the output capacitor 56 to develop the voltage signal $V_{SENSE}$.

From the foregoing, it should be clear that the present invention may be embodied in forms other than described above. The above-described example is therefore to be considered in all respects illustrative and not restrictive, the scope of the invention being indicated by the appended claims. rather than the foregoing description. All changes that come within the meaning and scope of the claims are intended to be embraced therein.

I claim:

1. An amplifier system for generating an output signal that tracks an audio input signal comprising:

linear amplification means for amplifying an input signal to obtain an amplified output signal, the linear amplification means having at least one supply terminal;

first amplification means for generating a first supply signal and applying the first supply signal to the at least one supply terminal of the linear amplification means, where the first amplification means comprises first control means for generating a first control signal based on the input signal, first switch means for generating a first pulsed power signal based on the first control signal, and first filter means for filtering the first pulsed power signal to obtain the first supply signal, the first filter means comprising a first filter inductor and a first filter capacitor; and first active damping means for damping perturbations in the first filter means, the first active damping means comprising current measuring means for generating a second control signal based on a current through the output capacitor, and means for altering the first control signal based on the second control signal.

2. The amplifier system as recited in claim 1, further comprising first compensation means for compensating at least in part for the frequency response of the damped first filter means.

3. The amplifier system as recited in claim 1, in which the linear amplification means comprises first and second supply terminals and the first supply signal is applied to the first supply terminal, the amplifier system further comprising second amplification means for generating a second supply signal and applying the second supply signal to the second supply terminal of the linear amplification means, where the second amplification means comprises second control means for generating a second control signal based on the input signal, second switch means for generating a second pulsed power signal based on the second control signal, and second filter means for filtering the second pulsed power signal to obtain the second supply signal, the second filter means comprising a second filter inductor and a second filter capacitor; and second active damping means for damping perturbations in the second filter means.

4. The amplifier system as recited in claim 3, further comprising:

first compensation means for compensating at least in part for the frequency response of the damped first filter means; and second compensation means for compensating at least in part for the frequency response of the damped second filter means.

5. The amplifier system as recited in claim 4, further comprising discharge means for discharging the first and second filter capacitors to prevent floating of the first and second supply voltages.

6. The amplifier system as recited in claim 3, in which the first active damping means damps perturbations in the first filter means based on a current through the first filter capacitor and the second active damping means damps perturbations in the second filter means based on a current through the second filter capacitor.

7. The amplifier system as recited in claim 1, in which the first active damping means damps perturbations in the first filter means by altering the first control signal.

8. The amplifier as recited in claim 3, in which the first active damping means damps perturbations in the first filter means by altering the first control signal and the second active damping means damps perturbations in the second filter means by altering the second control signal.

9. The amplifier system as recited in claim 2 in which the first compensation means compensates for the damped first filter means by altering the first control signal.

10. The amplifier as recited in claim 4, in which the first compensation means compensates for the damped first filter means by altering the first control signal and the second compensation means compensates for the damped second filter means by altering the second control signal.

11. The amplifier as recited in claim 1, further comprising a sense resistor arranged in series with the output capacitor, in which the first active damping means damps perturbations based on a voltage across the sense resistor.

12. The amplifier as recited in claim 1, further comprising a current sense circuit comprising a sampling capacitor and a sense resistor arranged in series with the sampling capacitor, where the sense circuit is arranged in parallel with the output capacitor and the first active damping means damps perturbations based on a voltage across the sense resistor.

13. The amplifier as recited in claim 12, in which a value of the sampling capacitor is at least three times the value of the output capacitor.

14. The amplifier as recited in claim 1, further comprising a sense circuit comprising:

a sampling capacitor having first and second terminals;

an operational amplifier having first and second input terminals and an output terminal, where the second input terminal is connected to the second terminal of the sampling capacitor; and a resistor connected between the second input terminal and the output terminal of the operational amplifier; wherein the sense circuit is connected in parallel across the output capacitor; and the first active damping means damps perturbations based on a voltage across the output terminal and the first input terminal of the operational amplifier.

15. The amplifier as recited in claim 1, further comprising a sense circuit comprising:

a current transformer having input and output windings, in which the input windings are connected in series with the output capacitor; and a sense resistor connected across the output terminals of the current transformer; wherein the first active damping means damps perturbations based on a voltage across the sense resistor.

16. The amplifier as recited in claim 1, further comprising a hall effect device arranged in series with the output capacitor, in which the first active damping means damps perturbations based on a voltage generated by the hall effect device.

17. An amplification method comprising the steps of:

generating a first control signal based on an input signal the amplitude of which varies over time;

operating a switch based on the first control signal to obtain a pulsed power signal;

filtering the pulsed power signal with an output filter to obtain an output signal that tracks the input signal;

generating a second control signal based on a current through an output capacitor in the output filter; and altering the first control signal based on the second control signal to damp perturbations in the output filter.

18. A method as recited in claim 17, further comprising the step of generating a second control signal based on a current through an output capacitor in the output filter, in which the step of altering the first control signal comprises the step Of altering the first control signal based on the second control signal.

19. A method as recited in claim 17, further comprising the step of altering the first control signal to compensate at least in part for the frequency response of the damped output filter.

20. A method as recited in claim 17, in which the step of generating the first control signal comprises the step of summing the input signal with a feedback signal derived from the output signal to obtain a voltage loop error signal, the first control signal being generated based on the voltage loop error signal.

21. A method as recited in claim 20, in which the step of altering the first control signal based on the second control signal comprises the step of adding the voltage loop error signal to the second control signal to obtain a current damping loop error signal, the first control signal being generated based on the current damping loop error signal.

22. A method as recited in claim 21, further comprising the step of modulating the current damping loop error signal based on a periodic signal to obtain the first control signal.

23. A method as recited in claim 22, further comprising the step of altering the voltage loop error signal to compensate at least in part for the frequency response of the damped output filter.

24. A method as recited in claim 17, further comprising the steps of arranging a sense resistor arranged in series with the output capacitor, in which the first active damping means damps perturbations based on a voltage across the sense resistor.

25. A method as recited in claim 17, further comprising the steps of:

providing a current sense circuit comprising a sampling capacitor and a sense resistor series with the sampling capacitor;

arranging the current sense circuit in parallel with the output capacitor; and damping perturbations in the first active damping means based on a voltage across the sense resistor.

26. A method as recited in claim 25, in which a value of the sampling capacitor is at least three times the value of the output capacitor.

27. A method as recited in claim 17, further comprising the steps of:

providing a sense circuit comprising (a) a sampling capacitor having first and second terminals and (b) an operational amplifier having first and second input terminals and an output terminal; and connecting the second input terminal to the second terminal of the sampling capacitor;

connecting a resistor between the second input terminal and the output terminal of the operational amplifier;

connecting the sense circuit, in parallel across the output capacitor; and damping perturbations based on a voltage across the output terminal and the first input terminal of the operational amplifier.

28. A method as recited in claim 17, further comprising the steps of:

providing a current transformer having input and output windings;

connecting the input windings of the current transformer in series with the output capacitor;

connecting a sense resistor across the output terminals of the current transformer; and damping perturbations based on a voltage across the sense resistor.

29. A method as recited in claim 17, further comprising the steps of:

arranging a hall effect device series with the output capacitor; and damping perturbations based on a voltage generated by the hall effect device.

30. An amplifier comprising:

control means for generating a first control signal based on an input signal the amplitude of which varies over time and a voltage loop feedback signal derived from an output signal;

switch means for generating a pulsed power signal based on the control signal;

output filter means for filtering the pulsed power signal to obtain the output signal such that the output signal tracks the input signal, where the output filter means comprises a filter inductor and a filter capacitor; and active damping means for damping perturbations in the output filter means, the active damping means comprising current measuring means for generating a second control signal based on a current through the output capacitor and means for altering the first control signal based on the second control signal.

31. An amplifier as recited in claim 30, in which the active damping means damps perturbations based on a current in the filter capacitor.

32. An amplifier as recited in claim 30, further comprising compensation means for compensating at least in part for the damped filter means.

33. An amplifier as recited in claim 30, in which the control means comprises means for summing the voltage loop feedback signal with the input signal to obtain a voltage loop error signal.

34. An amplifier as recited in claim 33, in which the active damping means comprises:

means for generating a current damping loop feedback signal corresponding to the current within the filter capacitor; and means for altering the control signal by summing the voltage loop error signal with the current damping loop feedback signal to obtain a current damping loop error signal.

35. An amplifier as recited in claim 34, further comprising modulator means for modulating the current damping loop error signal based on a periodic signal to obtain the control signal.

36. An amplifier that generates an output signal based on an input signal, comprising:

control means for generating a control signal based on an input signal the amplitude of which varies over time and a feedback signal derived from an output signal;

switch means for generating a pulsed power signal based on the control signal;

output filter means comprising an output inductor and an output capacitor for filtering the pulsed power signal to obtain the output signal, where the output signal varies with time;

active damping means for damping perturbations in the output filter means; and compensation means for compensating at least in part for a frequency response of the damped output filter means.

37. An amplifier as recited in claim 36, in which the control means comprises means for summing the voltage loop feedback signal with the input signal to obtain a voltage loop error signal.

38. An amplifier as recited in claim 37, in which the active damping means comprises:

means for generating a current damping loop feedback voltage corresponding to the current within the filter capacitor; and means for altering the control signal by summing the voltage loop error signal with the current damping loop feedback signal to obtain a current damping loop error signal.

39. An amplifier as recited in claim 38, further comprising modulator means for modulating the current damping loop signal based on a periodic signal to obtain the control signal.

40. An amplifier as recited in claim 39, in which the compensating means comprises means for altering the voltage loop error signal to compensate for the frequency response of the damped filter.

41. In a switch mode amplifier system having a first feedback loop for generating a control signal based on an input signal and a voltage loop feedback signal derived from an output signal of the amplifier;

switching means for generating a pulsed power signal based on the control signal; and an output filter having an inductor and a capacitor, where the output filter contributes first and second poles to the amplifier system that lie in the left half of the s-plane adjacent to the imaginary axis, where the first pole is spaced above real axis and the second pole is spaced below the real axis;

a method of stabilizing the amplifier system comprising the step of actively damping the output filter by altering the control signal based on a current through the capacitor of the output filter such that the first and second poles are moved away from the right half of the s-plane and substantially onto the real axis.

42. A method as recited in claim 41, further comprising the step of forward compensating at least in part for the frequency response of the actively damped output filter by providing circuitry that contributes first and second zeros to the amplifier system, where the first zero substantially cancels the first pole and the second zero substantially cancels the second pole.

43. An amplifier system for generating an output signal that tracks an audio input signal comprising:

linear amplification means for amplifying an input signal to obtain an amplified output signal, the linear amplification means having at least one supply terminal;

first amplification means for generating a first supply signal and applying the first supply signal to the at least one supply terminal of the linear amplification means, where the first amplification means comprises
    first control means for generating a first control signal based on the input signal,
    first switch means for generating a first pulsed power signal based on the first control signals and
    first filter means for filtering the first pulsed power signal to obtain the first supply signal, the first filter means comprising a first filter inductor and a first filter capacitor;

first active damping means for damping perturbations in the first filter means; and first compensation means for compensating at least in part for the frequency response of the damped first filter means.

44. The amplifier system as recited in claim 43, in which the first compensation means compensates for the damped first filter means by altering the first control signal.

45. An amplifier system for generating an output signal that tracks an audio input signal comprising:

linear amplification means for amplifying an input signal to obtain an amplified output signal, the linear amplification means having first and second supply terminals and the first supply signal is applied to the first supply terminal;

first amplification means for generating a first supply signal and applying the first supply signal to the first supply terminal of the linear amplification means, where the first amplification means comprises
    first control means for generating a first control signal based on the input signal,
    first switch means for generating a first pulsed power signal based on the first control signal, and
    first filter means for filtering the first pulsed power signal to obtain the first supply signal, the first filter means comprising a first filter inductor and a first filter capacitor;

second amplification means for generating a second supply signal and applying the second supply signal to the second supply terminal of the linear amplification means, where the second amplification means comprises
    second control means for generating a second control signal based on the input signal,
    second switch means for generating a second pulsed power signal based on the second control signals and
    second filter means for filtering the second pulsed power signal to obtain the second supply signals the second filter means comprising a second filter inductor and a second filter capacitor;

first active damping means for damping perturbations in the first filter means;

second active damping means for damping perturbations in the second filter means;

first compensation means for compensating at least in part for the frequency response of the damped first filter means; and second compensation means for compensating at least in part for the frequency response of the damped second filter means.

46. The amplifier system as recited in claim 45, further comprising discharge means for discharging the first and second filter capacitors to prevent floating of the first and second supply voltages.

47. The amplifier as recited in claim 45, in which the first compensation means compensates for the damped first filter means by altering the first control signal and the second compensation means compensates for the damped second filter means by altering the second control signal.

48. An amplifier system for generating an output signal that tracks an audio input signal comprising:

linear amplification means for amplifying an input signal to obtain an amplified output signal, the linear amplification means having first and second supply terminals and the first supply signal is applied to the first supply terminal;

first amplification means for generating a first supply signal and applying the first supply signal to the first supply terminal of the linear amplification means, where the first amplification means comprises
    first control means for generating a first control signal based on the input signal,
    first switch means for generating a first pulsed power signal based on the first control signal, and
    first filter means for filtering the first pulsed power signal to obtain the first supply signal, the first filter means comprising a first filter inductor and a first filter capacitor;

second amplification means for generating a second supply signal and applying the second supply signal to the second supply terminal of the linear amplification means, where the second amplification means comprises
    second control means for generating a second control signal based on the input signal,
    second switch means for generating a second pulsed power signal based on the second control signals and
    second filter means for filtering the second pulsed power signal to obtain the second supply signal, the second filter means comprising a second filter inductor and a second filter capacitor;

first active damping means for damping perturbations in the first filter means;

second active damping means for damping perturbations in the second filter means; wherein the first active damping means damps perturbations in the first filter means based on a current through the first filter capacitor and the second active damping means damps perturbations in the second filter means based on a current through the second filter capacitor.

49. An amplifier system for generating an output signal that tracks an audio input signal, comprising:

linear amplification means for amplifying an input signal to obtain an amplified output signal, the linear amplification means having first and second supply terminals and the first supply signal is applied to the first supply terminal;

first amplification means for generating a first supply signal and applying the first supply signal to the first supply terminal of the linear amplification means, where the first amplification means comprises first control means for generating a first control signal based on the input signal, first switch means for generating a first pulsed power signal based on the first control signal, and first filter means for filtering the first pulsed power signal to obtain the first supply signal, the first filter means comprising a first filter inductor and a first filter capacitor;

second amplification means for generating a second supply signal and applying the second supply signal to the second supply terminal of the linear amplification means, where the second amplification means comprises second control means for generating a second control signal based on the input signal, second switch means for generating a second pulsed power signal based on the second control signal, and second filter means for filtering the second pulsed power signal to obtain the second supply signal, the second filter means comprising a second filter inductor and a second filter capacitor;

first active damping means for damping perturbations in the first filter means;

second active damping means for damping perturbations in the second filter means; wherein the first active damping means damps perturbations in the first filter means by altering the first control signal and the second active damping means damps perturbations in the second filter means by altering the second control signal.

50. An amplifier system for generating an output signal that tracks an audio input signal comprising:

linear amplification means for amplifying an input signal to obtain an amplified output signal, the linear amplification means having at least one supply terminal;

first amplification means for generating a first supply signal and applying the first supply signal to the at least one supply terminal of the linear amplification means, where the first amplification means comprises first control means for generating a first control signal based on the input signal, first switch means for generating a first pulsed power signal based on the first control signal, and first filter means for filtering the first pulsed power signal to obtain the first supply signal, the first filter means comprising a first filter inductor and a first filter capacitor;

first active damping means for damping perturbations in the first filter means based on a current through the first filter capacitor;

first compensation means for compensating at least in part for the frequency response of the damped first filter means; and a current sense circuit comprising a sampling capacitor and a sense resistor arranged in series with the sampling capacitor, where the sense circuit is arranged in parallel with the output capacitor and the first active damping means damps perturbations based on a voltage across the sense resistor.

51. The amplifier as recited in claim 50, in which a value of the sampling capacitor is at least three times the value of the output capacitor.

52. An amplifier system for generating an output signal that tracks an audio input signal comprising:

linear amplification means for amplifying an input signal to obtain an amplified output signal, the linear amplification means having at least one supply terminal;

first amplifications means for generating a first supply signal and applying the first supply signal to the at least one supply terminal of the linear amplification means, where the first amplification means comprises first control means for generating a first control signal based on the input signal, first switch means for generating a first pulsed power signal based on the first control signal, and first filter means for filtering the first pulsed power signal to obtain the first supply signal, the first filter means comprising a first filter inductor and a first filter capacitor;

first active damping means for damping perturbations in the first filter means based on a current through the first filter capacitor;

first compensation means for compensating at least in part for the frequency response of the damped first filter means; and a sense circuit comprising a sampling capacitor having first and second terminals;

an operational amplifier having first and second input terminals and an output terminal, where the second input terminal is connected to the second terminal of the sampling capacitor; and a resistor connected between the second input terminal and the output terminal of the operational amplifier; wherein the sense circuit is connected in parallel across the output capacitor; and the first active damping means damps perturbations based on a voltage across the output terminal and the first input terminal of the operational amplifier.

53. An amplifier system for generating an output signal that tracks an audio input signal comprising:

linear amplification means for amplifying an input signal to obtain an amplified output signal, the linear amplification means having at least one supply terminal;

first amplification means for generating a first supply signal and applying the first supply signal to the at least one supply terminal of the linear amplification means, where the first amplification means comprises first control means for generating a first control signal based on the input signal, first switch means for generating a first pulsed power signal based on the first control signal, and first filter means for filtering the first pulsed power signal to obtain the first supply signal, the first filter means comprising a first filter inductor and a first filter capacitor;

first active damping means for damping perturbations in the first filter means based on a current through the first filter capacitor;

first compensation means for compensating at least in part for the frequency response of the damped first filter means; and a sense circuit comprising
  a current transformer having input and output windings, in which the input windings are connected in series with the output capacitor; and
  a sense resistor connected across the output terminals of the current transformer; wherein
the first active damping means damps perturbations based on a voltage across the sense resistor.

54. An amplifier system for generating an output signal that tracks an audio input signal comprising:
  linear amplification means for amplifying an input signal to obtain an amplified output signal, the linear amplification means having at least one supply terminal;
  first amplification means for generating a first supply signal and applying the first supply signal to the at least one supply terminal of the linear amplification means, where the first amplification means comprises
    first control means for generating a first control signal based on the input signal,
    first switch means for generating a first pulsed power signal based on the first control signal, and
    first filter means for filtering the first pulsed power signal to obtain the first supply signal, the first filter means comprising a first filter inductor and a first filter capacitor;
  first active damping means for damping perturbations in the first filter means based on a current through the first filter capacitor;
  first compensation means for compensating at least in part for the frequency response of the damped first filter means; and
  a hall effect device arranged in series with the output capacitor, in which the first active damping means damps perturbations based on a voltage generated by the hall effect device.

55. An amplification method comprising the steps of:
  generating a first control signal based on an input signal the amplitude of which varies over time;
  operating a switch based on the first control signal to obtain a pulsed power signal;
  filtering the pulsed power signal with an output filter to obtain an output signal that tracks the input signal;
  generating a second control signal based on a current through an output capacitor in the output filter; and
  altering the first control signal based on the second control signal to damp perturbations in the output filter.

56. An amplification method comprising the steps of:
  generating a first control signal based on an input signal the amplitude of which varies over time;
  operating a switch based on the first control signal to obtain a pulsed power signal;
  filtering the pulsed power signal with an output filter to obtain an output signal that tracks the input signal;
  altering the first control signal to damp perturbations in the output filter; and
  altering the first control signal to compensate at least in part for the frequency response of the damped output filter.

57. An amplification method comprising the steps of:
  generating a first control signal based on an input signal the amplitude of which varies over time by summing the input signal with a feedback signal derived from the output signal to obtain a voltage loop error signal, where the first control signal is generated based on the voltage loop error signal;
  operating a switch based on the first control signal to obtain a pulsed power signal;
  filtering the pulsed power signal with an output filter to obtain an output signal that tracks the input signal; and
  altering the first control signal to damp perturbations in the output filter.

58. A method as recited in claim 57, in which the step of altering the first control signal based on the second control signal comprises the step of adding the voltage loop error signal to the second control signal to obtain a current damping loop error signal, the first control signal being generated based on the current damping loop error signal.

59. A method as recited in claim 58, further comprising the step of modulating the current damping loop error signal based on a periodic signal to obtain the first control signal.

60. A method as recited in claim 59, further comprising the step of altering the voltage loop error signal to compensate at least in part for the frequency response of the damped output filter.

61. An amplification method comprising the steps of:
  generating a first control signal based on an input signal the amplitude of which varies over time;
  operating a switch based on the first control signal to obtain a pulsed power signal;
  filtering the pulsed power signal with an output filter to obtain an output signal that tracks the input signal;
  providing a current sense circuit comprising a sampling capacitor and a sense resistor series with the sampling capacitor, arranging the current sense circuit in parallel with the output capacitor, and damping perturbations in the first active damping means based on a voltage across the sense resistor.

62. A method as recited in claim 61, in which a value of the sampling capacitor is at least three times the value of the output capacitor.

63. An amplification method comprising the steps of:
  generating a first control signal based on an input signal the amplitude of which varies over time;
  operating a switch based on the first control signal to obtain a pulsed power signal;
  filtering the pulsed power signal with an output filter to obtain an output signal that tracks the input signal;
  providing a sense circuit comprising (a) a sampling capacitor having first and second terminals and (b) an operational amplifier having first and second input terminals and an output terminal;
  connecting the second input terminal to the second terminal of the sampling capacitor;
  connecting a resistor between the second input terminal and the output terminal of the operational amplifier;
  connecting the sense circuit in parallel across the output capacitor; and
  altering the first control signal based on a voltage across the output terminal and the first input terminal of the operational amplifier to damp perturbations in the output filter.

64. An amplification method comprising the steps of:
  generating a first control signal based on an input signal the amplitude of which varies over time;
  operating a switch based on the first control signal to obtain a pulsed power signal;
  filtering the pulsed power signal with an output filter to obtain an output signal that tracks the input signal;
  providing a current transformer having input and output windings;

connecting the input windings of the current transformer in series with the output capacitor;

connecting a sense resistor across the output terminals of the current transformer; and altering the first control signal based on a voltage across the sense resistor to damp perturbations in the output filter.

65. An amplification method comprising the steps of:

generating a first control signal based on an input signal the amplitude of which varies over time;

operating a switch based on the first control signal to obtain a pulsed power signal;

filtering the pulsed power signal with an output filter to obtain an output signal that tracks the input signal;

arranging a hall effect device in series with the output capacitor; and altering the first control signal based on a voltage generated by the hall effect device to damp perturbations in the output filter.

66. An amplifier comprising:

control means for generating a control signal based on an input signal the amplitude of which varies over time and a voltage loop feedback signal derived from an output signal;

switch means for generating a pulsed power signal based on the control signal;

output filter means for filtering the pulsed power signal to obtain the output signal such that the output signal tracks the input signal, where the output filter means comprises a filter inductor and a filter capacitor;

active damping means for damping perturbations in the output filter means based on a current in the filter capacitor; and compensation means for compensating at least in part for the damped filter means.

67. An amplifier comprising:

control means for generating a control signal based on an input signal the amplitude of which varies over time and a voltage loop feedback signal derived from an output signal, the control means comprising means for summing the voltage loop feedback signal with the input signal to obtain a voltage loop error signal;

switch means for generating a pulsed power signal based on the control signal;

output filter means for filtering the pulsed power signal to obtain the output signal such that the output signal tracks the input signal, where the output filter means comprises a filter inductor and a filter capacitor;

active damping means for damping perturbations in the output filter means, the actives damping means comprising means for generating a current damping loop feedback signal corresponding to the current within the filter capacitor; and means for altering the control signal by summing the voltage loop error signal with the current damping loop feedback signal to obtain a current damping loop error signal.

68. An amplifier as recited in claim 67, further comprising modulator means for modulating the current damping loop error signal based on a periodic signal to obtain the control signal.

69. In a switch mode amplifier system having a first feedback loop for generating a control signal based on an input signal and a voltage loop feedback signal derived from an output signal of the amplifier;

switching means for generating a pulsed power signal based on the control signal; and an output filter having an inductor and a capacitor, where the output filter contributes first and second poles to the amplifier system that lie in the left half of the s-plane adjacent to the imaginary axis, where the first pole is spaced above real axis and the second pole is spaced below the real axis;

a method of stabilizing the amplifier system comprising the steps of:

actively damping the output filter such that the first and second poles are moved away from the right half of the s-plane and substantially onto the real axis; and forward compensating at least in part for the frequency response of the actively damped output filter by providing circuitry that contributes first and second zeros to the amplifier system, where the first zero substantially cancels the first pole and the second zero substantially cancels the second pole.

* * * * *